US010635599B2

(12) United States Patent
Duzly et al.

(10) Patent No.: US 10,635,599 B2
(45) Date of Patent: Apr. 28, 2020

(54) MEMORY CONTROLLER ASSISTED ADDRESS MAPPING

(71) Applicant: SanDisk Technologies LLC, Addison, TX (US)

(72) Inventors: Yacov Duzly, Raanana (IL); Yan Li, Milpitas, CA (US); Idan Alrod, Herzeliya (IL)

(73) Assignee: SanDisk Technologies LLC, Addison, TX (US)

( * ) Notice: Subject to any disclaimer, the term of this patent is extended or adjusted under 35 U.S.C. 154(b) by 7 days.

(21) Appl. No.: 16/046,287

(22) Filed: Jul. 26, 2018

(65) Prior Publication Data

US 2020/0034307 A1 Jan. 30, 2020

(51) Int. Cl.
*G06F 12/10* (2016.01)
*G06F 11/10* (2006.01)
*G11C 29/52* (2006.01)

(52) U.S. Cl.
CPC .......... *G06F 12/10* (2013.01); *G06F 11/1068* (2013.01); *G11C 29/52* (2013.01); *G06F 2212/1044* (2013.01); *G06F 2212/657* (2013.01)

(58) Field of Classification Search
CPC .................................................. G06F 11/1076
USPC ................................ 714/764, 768, 763, 766
See application file for complete search history.

(56) References Cited

U.S. PATENT DOCUMENTS

| 9,189,392 | B1 | 11/2015 | Nepalli et al. |
| 9,582,358 | B2 | 2/2017 | Agarwal et al. |
| 9,652,379 | B1 | 3/2017 | Kuzmin et al. |
| 2005/0144357 | A1 | 6/2005 | Sinclair |
| 2005/0149686 | A1 | 7/2005 | Bacon et al. |
| 2007/0255924 | A1 | 11/2007 | Moyer et al. |
| 2008/0205607 | A1* | 8/2008 | Tagane ................ H04L 65/1046 379/93.01 |
| 2010/0061154 | A1* | 3/2010 | Lusky .................. G06F 3/0608 365/185.28 |
| 2010/0161882 | A1 | 6/2010 | Stern et al. |

(Continued)

FOREIGN PATENT DOCUMENTS

| CN | 104298605 | 1/2015 |
| CN | 107533506 | 1/2018 |

(Continued)

OTHER PUBLICATIONS

C. Sun, A. Soga, C. Matsui, A. Arakawa and K. Takeuchi, "LBA Scrambler: A NAND Flash Aware Data Management Scheme for High-Performance Solid-State Drives," in IEEE Transactions on Very Large Scale Integration (VLSI) Systems, vol. 24, No. 1, pp. 115-128, Jan. 2016.

*Primary Examiner* — Fritz Alphonse
(74) *Attorney, Agent, or Firm* — Vierra Magen Marcus LLP

(57) ABSTRACT

An apparatus includes a storage controller, a non-volatile memory die comprising a set of memory elements and a memory die controller associated with the non-volatile memory die. The memory die controller is configured to identify a portion of the non-volatile memory die for mapping logical addresses, read a header of a sub-portion of the identified portion, for a logical address, map a physical address corresponding to the logical address of the sub-portion to a physical-to-logical mapping and transmit the physical-to-logical mapping to the storage controller.

25 Claims, 10 Drawing Sheets

(56) References Cited

U.S. PATENT DOCUMENTS

| | | |
|---|---|---|
| 2011/0119455 A1 | 5/2011 | Tsai et al. |
| 2013/0166818 A1 | 6/2013 | Sela |
| 2015/0178194 A1 | 6/2015 | Shaharabany et al. |
| 2015/0220277 A1 | 8/2015 | Lee et al. |
| 2016/0092325 A1 | 3/2016 | Bar et al. |
| 2016/0291872 A1 | 10/2016 | Hashimoto et al. |
| 2017/0010937 A1 | 1/2017 | Thakore et al. |
| 2019/0102250 A1* | 4/2019 | O'Krafka ............ G06F 11/1068 |
| 2019/0129834 A1* | 5/2019 | Purkayastha ....... G06F 12/0215 |

FOREIGN PATENT DOCUMENTS

| | | |
|---|---|---|
| TW | 201737089 | 10/2017 |
| WO | 2016209595 | 12/2016 |

* cited by examiner

600
↓

|   | 3 | 2 | 1 | 0 |
|---|---|---|---|---|
| 0 |   | 960 |   | 1000 |
| 1 | 500 |   |   |   |
| 2 |   |   | 2000 |   |
| 3 |   |   |   |   |
| 4 |   |   |   |   |
| ... |   |   |   |   |
| 254 |   |   |   |   |
| 255 | 240 |   |   |   |

606 points to column 2 header; 604 points to cell (0,0)=1000; 602 points to rows 3-4

| 0 | 1000 | ← 612 |
| 1 | FFFF |   |
| 2 | 960 |   |
| 3 | FFFF |   |
| 4 | FFFF | ← 614 |
| 5 | FFFF |   |
| 6 | FFFF |   |
| 7 | 500 |   |
| 8 | FFFF |   |
| 9 | 2000 |   |
| ... |   |   |
| 1023 | 240 |   |

*Figure 6B*

MEMORY CONTROLLER ASSISTED ADDRESS MAPPING

BACKGROUND

Field

This disclosure relates to computing devices. More particularly, the disclosure relates to systems and methods for mapping physical to logical addresses in memory devices.

Description of Related Art

In certain computing systems, such as solid-state data storage systems, performing all address mapping functions at a storage device-level controller can negatively impact performance and/or efficiency.

SUMMARY

In some implementations, the present disclosure relates to a an apparatus comprising a non-volatile memory die and a memory die controller associated with the non-volatile memory die. In response to a mapping request from a storage controller, the memory die controller is configured to read a logical address from a header of a sub-portion of memory, map a physical address corresponding to the logical address of the sub-portion within a physical-to-logical mapping and transmit the physical-to-logical mapping to the storage controller. In some implementations the memory die controller is further configured to identify a portion of the non-volatile memory die for mapping logical addresses (e.g., from the mapping request).

The storage controller may be further configured to send a mapping request to the memory die controller. The mapping request may be configured to return the physical-to-logical mapping. In some embodiments the mapping request comprises information identifying the portion of the non-volatile memory die and a number of sub-portions to read in the portion. For example, the mapping request may identify a block of memory in a non-volatile memory die, and a number of sub-pages to read for purposes of obtaining addressing information in the block. The mapping request map identify a physical address of a block of memory and a number of sub-pages to map in the block of memory. The storage controller may also be configured to provide, or transmit the mapping request to the non-volatile memory die or control circuitry thereof. In some embodiments the storage controller is further configured to receive a host command to initiate a garbage collection operation on a set of data stored on the non-volatile memory die. For example, the storage controller may be communicatively coupled to a host device or system and may receive the host command from such host device or system over a communication bus or another form of wired or wireless communication.

In some embodiments, the storage controller is further configured to obtain the physical-to-logical mapping of the portion of the non-volatile memory die and to parse the physical-to-logical mapping for errors. For example, the storage controller may be configured to receive the physical-to-logical mapping from the non-volatile memory die, read the physical-to-logical mapping and check it for any corrupt information. The storage controller may be further configured to determine an invalid logical address in the physical-to-logical mapping, retrieve error correction information corresponding to the invalid logical address and generate a valid value of the determined invalid logical address, using the error correction information.

In some embodiments, the storage controller is further configured to correct data errors in the physical-to-logical mapping. The storage controller may further be configured to determine that a logical address in the physical-to-logical mapping is corrupted, retrieve error correction information corresponding to the corrupted logical address and generate a corrected value of the determined corrupted logical address, using the error correction information.

In some implementations, the present disclosure relates to an apparatus comprising a storage controller coupled to a host, a non-volatile memory die and a memory die controller coupled to the storage controller and associated with the non-volatile memory die. The memory die controller may be configured to receive a mapping request from the host, extract identification information from the mapping request to identify a portion of the non-volatile memory die for mapping logical addresses, generate physical-to-logical addressing information corresponding to the portion of the non-volatile memory and transmit the physical-to-logical addressing information to the host.

The memory die controller may be further configured to receive the mapping request from the storage controller and transmit the physical-to-logical addressing information to the storage controller for transmission to the host. For example, the memory die controller may receive a mapping request generated by a host, but obtained via the storage controller. In other words, the mapping request may be passed-through the storage controller from the host to the memory die controller, and the physical-to-logical addressing information may be transmitted to the host via the storage controller as well.

In some implementations, the present disclosure relates to an apparatus comprising a storage device controller, a plurality of non-volatile memory die and a plurality of memory die controllers. Each respective memory die controller may be coupled to a respective non-volatile memory die and the storage controller, and include request communication circuitry configured to receive a mapping request from the storage device controller identifying a portion and a number of sub-portions of the respective non-volatile memory die for mapping logical addresses. Each respective memory die controller may further include an address decoder configured to decode information in a header of each sub-portion of the identified portion to retrieve a logical address, addressing information generation circuitry configured to generate addressing information from the logical address of each sub-portion and addressing communication circuitry configured to send addressing information of the identified portion to the storage controller. For example, the addressing information generation circuitry may be configured to format the addressing information as a particular data type (e.g., string, bitmap), and format the addressing information in a particular way for optimized reading by the storage controller or host.

Each sub-portion of memory may include a respective header comprising a respective logical address and a corresponding body comprising error correction information of the respective logical address. In some embodiments, the mapping request includes a portion indicator corresponding to the portion of the respective non-volatile memory die. For example, the mapping request includes a block number (or physical address) corresponding to a block of a non-volatile memory die, and may also indicate a number of sub-portions (e.g., pages, sub-pages) to map. The mapping request may include additional information or parameters corresponding to the parsing and mapping of the information.

In some embodiments, the storage device controller comprises map maintenance circuitry configured to relate each logical address in the addressing information with a physical address of a sub-portion to form a physical-to-logical map of the portion. The map maintenance circuitry may also be configured to maintain and update a logical-to-physical addressing table for all units of memory in the storage device. For example, the map maintenance circuitry modifies a data structure stored in storage device controller memory which includes a listing of logical addresses associated with data written to memory of the storage device (e.g., one or more memory die) and corresponding physical addresses of pages or sub-pages.

In some implementations, the present disclosure relates to an apparatus comprising a storage device controller, a plurality of non-volatile memory die and a plurality of memory die controllers. Each memory die controller may be coupled to a respective non-volatile memory die and the storage device controller and include request communication circuitry configured to receive an addressing request originating from the host, a memory parser configured to parse each sub-portion of a portion of memory on a sequential basis, for a logical address, mapping generation circuitry configured to generate a set of physical-to-logical mapping information from the logical address of each sub-portion and addressing communication circuitry configured to send addressing information of the identified portion to the host.

The addressing request may be generated by the storage controller in response to receiving a host command at the storage controller from the host. In some embodiments, the addressing request is generated by the host, and each respective memory die controller is further configured to receive the addressing request from the storage controller.

In some implementations, the present disclosure relates to an apparatus comprising a storage controller, a plurality of non-volatile memory die and a plurality of non-volatile memory controllers associated with the plurality of non-volatile memory die. Each non-volatile memory controller may comprise means for reading a respective sub-portion of a portion of a respective non-volatile memory die, means for retrieving a logical address stored in the respective sub-portion and identified by a respective physical address. Each non-volatile memory controller may also comprise means for determining if the logical address has one or more errors and means for storing the logical address with the respective physical address in a physical-to-logical table, in accordance with a determination that the logical address does not have one or more errors.

In some embodiments, each non-volatile memory controller further comprises means for identifying an erroneous value of the logical address in the physical-to-logical table, in accordance with a determination that the logical address has one or more errors. The storage controller may further comprise means for determining validity of each respective physical address stored in the physical-to-logical mapping, and means for creating a validity map of valid physical addresses of the portion. The storage controller further comprises means for performing garbage collection operations on the portion of the non-volatile memory die using the validity map.

In some implementations, the present disclosure relates to a method comprising, receiving a control command at a memory die controller of a storage device from a storage controller of the storage device, to extract a physical-to-logical mapping of a portion of a non-volatile memory die corresponding to the memory die controller. The method may include generating a physical-to-logical mapping for the portion of the non-volatile memory die indexed by physical addresses of the portion and sending the physical-to-logical mapping to the storage controller.

In some embodiments, generating the physical-to-logical mapping includes reading a respective header of each respective sub-portion of the portion, each sub-portion identified by a respective physical address. For example, the portion may be a block of memory, and each sub-portion may be a sub-page of the block, where each sub-page has a physical address. Additionally, the sub-portion may have a header comprising logical address information and a body comprising data and error correction information.

Generating the physical-to-logical mapping may further include detecting a first logical address at a first physical address of the portion of the non-volatile memory die, extracting the first logical address from a header of the first physical address and determining if the first logical address has one or more errors. For example, the first logical address may reside in a header of the sub-portion identified by the first physical address, and may be found to include erroneous information using one or more known error detection techniques.

The method may further comprise, in accordance with a determination that the first logical address has one or more errors, extracting error detection information corresponding to the first logical address stored at the first physical address and replacing a value of the extracted first logical address with a corrected value using the error detection information. In some embodiments, the method further comprises, in accordance with a determination that the first logical address has one or more errors, indicating the first physical address corresponding to the first logical address is invalid in the physical-to-logical mapping.

In some embodiments, the physical-to-logical mapping includes a table of a set of physical addresses of the portion and a corresponding set of logical addresses of the portion. The method may further include comparing, at the storage controller, each physical address and logical address in the physical-to-logical mapping to a logical-to-physical mapping of data stored in the storage device, determining validity of each respective physical address of the set of physical addresses in the physical-to-logical mapping, creating a validity map of the valid physical addresses of the portion and performing garbage collection operations on the portion of the non-volatile memory die using the validity map.

Determining validity of each respective physical address may include determining duplication of any respective logical address in the set of logical addresses in the physical-to-logical mapping. Additionally or alternatively, in some embodiments, determining validity of each respective physical address includes performing a lookup in a logical-to-physical table to validate the respective physical address. In some embodiments, determining validity of each respective physical address includes performing one or more error correction operations on an identified invalid physical address in the portion. In some embodiments, determining validity of each respective physical address includes performing additional lookup in the logical-to-physical mapping table to validate the entry.

In some implementations, the present disclosure relates to a system comprising a board comprising electrical connections, a storage controller die mounted on the board and a memory die mounted on the board and electrically coupled to the storage controller die via the electrical connections.

The memory die may include a solid-state memory array comprising a plurality of portions of non-volatile memory and control circuitry coupled to the memory array via a plurality of control lines. The control circuitry may be configured to communicate with the storage controller die to report on physical-to-logical addressing of a portion of the memory array, read each sub-portion of the portion of the memory array for a corresponding logical address, analyze the corresponding logical address for erroneous information, assemble the physical-to-logical addressing of the portion and transmit to the storage controller die a string representing the physical-to-logical addressing of the portion. In some embodiments, the string includes one or more identified erroneous logical addresses in the portion of the memory array.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

FIG. 6A is a block diagram of a memory portion in accordance with one or more embodiments.

FIG. 6B is a block diagram of a table of addressing information in accordance with one or more embodiments.

DETAILED DESCRIPTION

Figure 1:
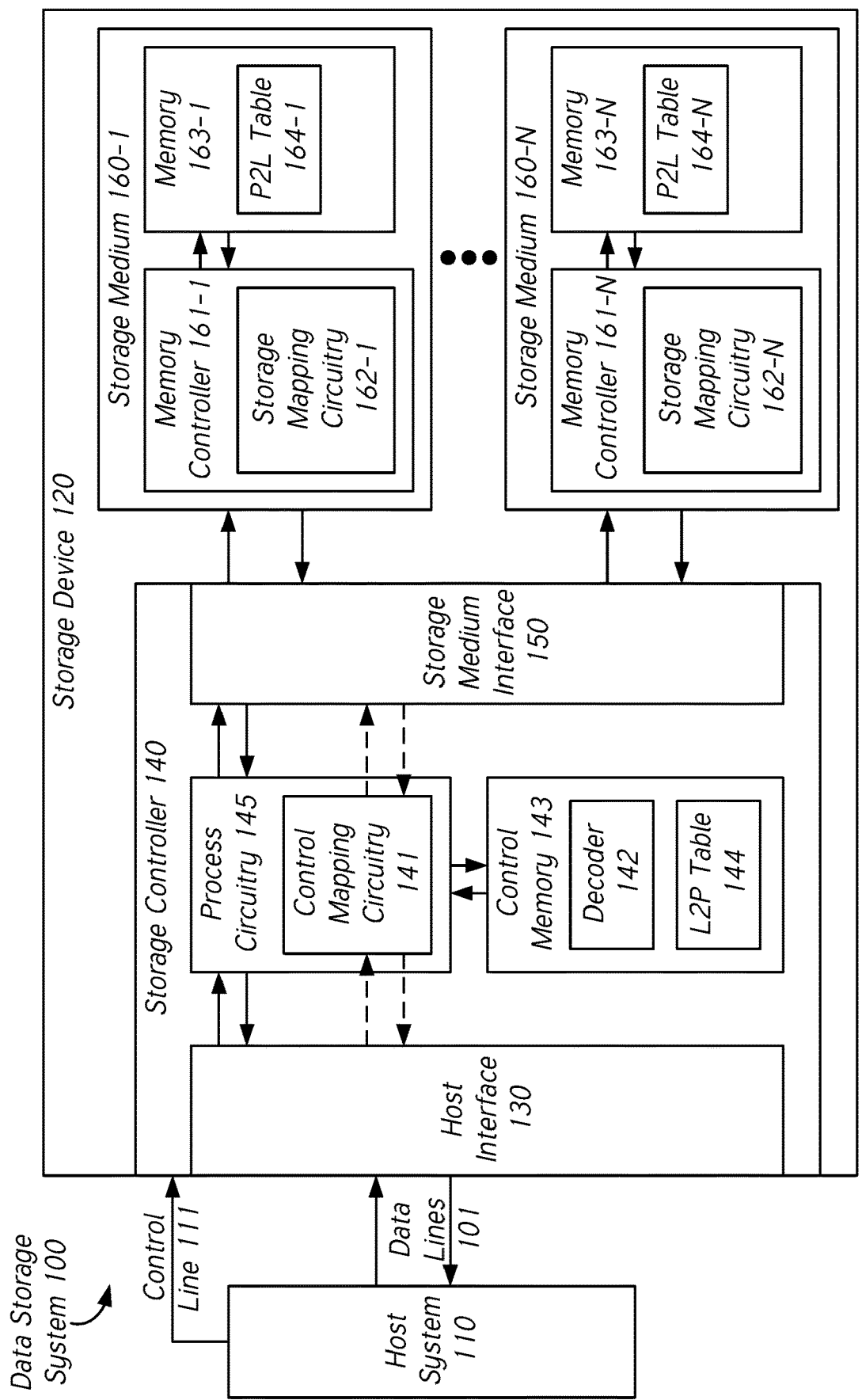
FIG. 1 is a block diagram illustrating an implementation of a data storage system, in accordance with some embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to retrieval of addressing information of memory portions in computing devices, such as solid-state data storage devices.

Overview

In solid-state data storage devices and systems, certain processing operations may be performed by centralized processing circuitry in communication with one or more storage media, and in communication with a host. These processing operations may involve an inefficient transfer of large amounts of information stored on the one or more storage media, to the centralized processing circuitry. For example, in order to perform a garbage collection operation on a block of memory in a storage medium, the centralized processing circuitry may retrieve data in the block of memory to determine occupation of information in pages, sub-pages or other divisions of memory within the block. In some implementations, the centralized processing circuitry may proceed to parse the entire block of data for addressing information corresponding to the divisions of memory occupied with information. Additionally, some of the memory may require application of error correction techniques to adequately determine the addressing information. As a result, centralized processing circuitry and communication channels between the centralized processing circuitry and one or more storage media may become overly burdened with the large volume of information transferred for the purpose of determining addressing information of a storage medium.

As described in detail herein, with respect to operations such as garbage collection that rely on addressing information of portions of memory in a storage device, storage-medium control circuitry (otherwise referred to as non-volatile memory control circuitry, a memory controller or a memory die controller) may determine addressing information without transferring large volumes of data to a storage controller (e.g., storage device control circuitry). Therefore, by determining addressing information of a portion of memory using storage medium control circuitry directly associated with the portion of memory, a significant reduction of computing overhead may be achieved at the storage controller (e.g., control circuitry for the entire storage device). Additionally, available communication bandwidth between the storage controller and a set of memory controllers may be increased.

As used in this application, "non-volatile solid-state memory," "non-volatile memory," "non-volatile memory die", "NVM," "solid-state memory," "solid-state data storage," "semiconductor memory die" or variations thereof may refer to solid-state memory such as NAND flash. However, the systems and methods of this disclosure may also be useful in more conventional hard drives and hybrid drives including both solid-state and hard drive components. In some embodiments, the solid-state memory may be used in a computing device to extend storage capacity of volatile memory such as DRAM. Solid-state memory may comprise a wide variety of technologies, such as flash integrated circuits, Phase Change Memory (PCM, PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), Magnetoresistive RAM (MRAM), or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Solid-State Data Storage

FIG. 1 is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120, which includes storage controller 140 (sometimes referred to as a storage device controller, storage control circuitry or control circuitry), which may include host interface 130, process circuitry 145, storage medium interface 150 and control memory 143 (which may comprise decoder 142 and logical-to-physical (L2P) table 144). In some embodiments, control memory 143 includes additional circuitry, modules or data structures not shown in FIG. 1, including but not limited to the ones described with respect to FIG. 2. In some embodiments, process circuitry 145 includes additional circuitry, modules or data structures such as control mapping circuitry 141, shown in FIG. 1. Control mapping circuitry 141 may represent a subset of circuitry in process circuitry 145 devoted to managing processes related to generating, maintaining or comparing addressing information of one or more storage media 160 of storage device 120.

Host or host system 110 may be coupled to storage device 120 through data connections or data lines 101. Host system 110 may be a computing device, such as a personal computer, a workstation or a computer server. Host system 110 is sometimes called a computer system. Host system 110 may include one or more processors, one or more types of memory, and a display and/or other user interface components such as a keyboard, a touch screen display, a mouse, a track-pad, a digital camera and/or any number of supplemental devices to add functionality. Further, in some embodiments, host system 110 sends one or more host commands (e.g., read commands and write commands) on control line 111 to storage device 120, while in other embodiments host system 110 sends host commands to storage device 120 via data connections or data lines 101. In some implementations, host system 110 is a server system, such as a server system in a data center, and does not have a display and other user interface components.

In this non-limiting example, data storage system 100 is used in conjunction with host system 110. In some embodiments, host interface 130 comprises circuitry and/or components to allow a communication exchange between host system 110 and storage device 120. Host interface 130 may be included in storage controller 140, as shown in FIG. 1. Alternatively, host interface 130 may be included in storage device 120 but not included in storage controller 140. Host interface 130 may be configured to receive host commands from host system 110, and to respond to host commands by transmitting responses to host system 110. In some embodiments, communications between host system 110 and one or more circuits (e.g., control mapping circuitry 141 and process circuitry 145) of storage controller 140 are facilitated by host interface 130. For example, host commands received at host interface 130 may be forwarded to process circuitry 145. In some embodiments, all host commands received at host interface 130 are first forwarded to process circuitry 145, which may be communicatively coupled to one or more circuits, modules or data structures of storage controller 140.

Storage controller 140 may also include process circuitry 145, which may be configured to perform management tasks of storage device 120. In some embodiments, all host commands first pass to process circuitry 145, before being transmitted to one or more circuits, components or modules within storage controller 140. For example, process circuitry 145 may receive a host command to perform one or more addressing operations on storage media of storage device 120, from host system 110, through host interface 130. In this example, process circuitry 145 may be configured to determine that the addressing host command should be forwarded to another circuit, such as control mapping circuitry 141. In some embodiments, process circuitry 145 may receive and analyze a received host command and generate instructions for one or more circuits, components or modules of storage controller 140 in response to the analysis of the host command. For example, process circuitry 145 may receive an addressing host command, analyze the host command and generate an instruction for control mapping circuitry 141 to provide a physical-to-logical table for a particular block of memory within storage device 120. This received physical-to-logical table may be used by the storage controller 140 for garbage collection operations. In some embodiments, one or more circuits, components or modules of storage controller 140 may be configured to directly receive a host command from host system 110, as depicted by the dotted lines of communication between host interface 130 and control mapping circuitry 141. Process circuitry 145 may include or may be coupled to one or more processing units (also sometimes called CPUs, processors, hardware processors, microprocessors or microcontrollers) configured to execute instructions in one or more programs. Process circuitry 145 may include circuitry, processes and/or mechanisms for management of memory 163 in each respective storage medium 160, such as, but not limited to, a flash translation layer (FTL).

In some embodiments, storage controller 140 includes control memory 143. Control memory 143 may be electrically and/or communicatively coupled to one or more circuits, components or modules within storage controller 140, such as process circuitry 145. In some embodiments, control memory 143 is configured to store information for the one or more coupled circuits, components or modules. Control memory 143 may further include circuitry, components, data structures or modules such as decoder 142 and logical-to-physical table 144. In some embodiments, decoder 142 is configured to decode addressing information corresponding to memory in a storage medium 160. For example, a physical address of a page (or other unit) of memory may be determined by de-multiplexing addressing information corresponding to the page, using decoder 142. Logical-to-physical table 144 may be configured to store logical addresses with corresponding physical addresses of stored information in one or more storage media 160 of storage device 120.

The term "control circuitry" is used herein according to its broad and ordinary meaning, and may refer to any circuitry, module, device or component of the non-volatile storage device 120 configured to perform any of the functional aspects of the present disclosure. For example, one or any combination of the storage controller 140 (e.g., control circuitry or storage device control circuitry), the host interface 130, the process circuitry 145, the control mapping circuitry 141, the control memory 143, the decoder 142, the logical-to-physical table 144, and/or the storage medium interface 150 can be referred to as "control circuitry." The control circuitry (including storage controller 140) of the non-volatile storage device 120 may provide a means for providing addressing information of a portion of memory in one or more storage media 160 in accordance with aspects of the present disclosure.

Storage medium interface 150 of storage controller 140 may be configured to facilitate transfer of information, such as instructions, commands, control signals and data, between storage controller 140 and one or more storage media 160. In some embodiments, storage medium interface 150 comprises circuitry and/or components to allow a communication exchange between storage controller 140 and a respective storage medium 160. Storage medium interface 150 may be included in storage controller 140, as shown in FIG. 1. Alternatively, storage medium interface 150 may be included in storage device 120 but not included in storage controller 140.

Data storage system 100 may also include one or more storage media 160 (e.g., a storage medium 160-1 to storage medium 160-N depicted in FIG. 1). In some embodiments, a respective storage medium 160 may be a semiconductor die, or memory module comprising multiple die. In some embodiments, each storage medium 160 includes memory controller 161 (sometimes referred to as a memory die controller or storage control circuitry), and memory 163. Memory controller 161 may include particular circuits, modules or data structures such as, but not limited to, storage mapping circuitry 162. In some implementations, memory controller 161 includes one or more processing units (also sometimes called CPUs, processors, hardware processors, microprocessors or microcontrollers) configured to execute instructions in one or more programs. In some embodiments, memory 163 of a respective storage medium 160 is coupled to memory controller 161 through connections that typically convey commands in addition to data, and optionally convey metadata, error correction information and/or other information in addition to data values to be stored in memory 163 and data values read from memory 163. Storage medium 160 and/or memory 163 may be configured for enterprise storage suitable for applications such as cloud computing, or for caching data stored in secondary storage, such as hard disk drives. Additionally and/or alternatively, storage medium 160 and/or memory 163 may also be configured for relatively smaller-scale applications such as personal flash drives or hard-disk replacements for personal, laptop and tablet computers. Although flash memory devices and flash controllers are used as an example here, storage device 120 may include any other non-volatile memory device(s) and corresponding non-volatile memory control circuitry.

The term "storage control circuitry" is used herein according to its broad and ordinary meaning, and may refer to any circuitry, module, device or component of the non-volatile storage medium 160 configured to perform any of the functional aspects of the present disclosure. The storage control circuitry (including memory controller 161) of the non-volatile storage medium 160 may provide a means for providing addressing information of a portion of memory in storage medium 160 in accordance with aspects of the present disclosure.

Figure 3:
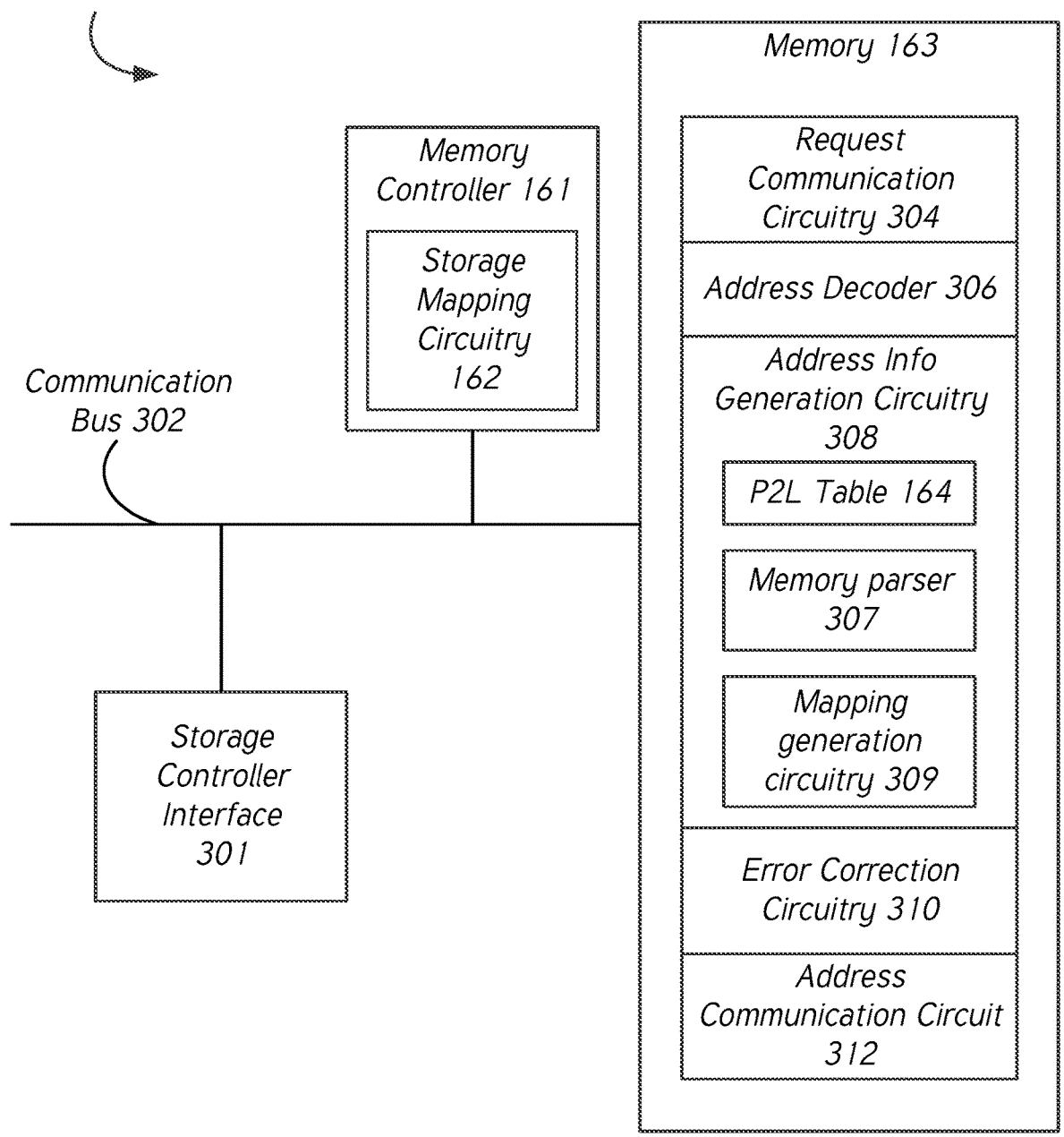
FIG. 3 is a block diagram illustrating an implementation of a storage medium, in accordance with some embodiments.

Memory 163 may include particular circuits, modules or data structures such as, but not limited to, physical-to-logical (P2L) table 164, or others described with respect to FIG. 3. In some implementations, memory 163 of storage medium 160 includes NAND-type flash memory or NOR-type flash memory. Further, in some implementations, memory controller 161 comprises a solid-state drive (SSD) controller. However, one or more other types of storage media may be included in accordance with aspects of a wide variety of implementations. In some embodiments, the physical-to-logical (P2L) table 164 is maintained in the memory controller 161.

Memory cells of memory 163 of each storage medium 160 of FIG. 1 may be arranged according to a NAND flash memory structure. A solid-state memory array, such as a NAND flash array, may include memory cell units, also referred to as "NAND strings," or "memory strings," each unit comprising a memory cell group that includes a plurality of serially-connected solid-state storage elements, or memory elements. "Solid-state storage elements," "memory elements" or "data storage cells," may comprise memory cell transistors. The terms "solid-state storage element," "memory element" and "data storage cell" are used herein according to their broad and ordinary meaning, and may refer to any device, transistor, cell, unit, or plurality or combination of the same, configured to exhibit a particular electrical or magnetic or electromagnetic characteristic, which characteristic represents a value representative of data, as described herein.

In some embodiments, memory 163 of storage media 160 includes non-volatile memory, such as flash memory. Such non-volatile memory may not be configured to update the contents of used portions (e.g., blocks) or sub-portions (e.g., pages or sub-pages) of the non-volatile memory without first erasing the used portions. As such, garbage collection is a technique that may allow storage device 120 to efficiently re-distribute used portions or sub-portions of memory to provide more available storage space in contiguous portions or sub-portions of unused memory. One aspect of garbage collection is to determine how data is distributed throughout memory 163 of a storage media 160, and if there is a need to redistribute the data. A physical-to-logical mapping of the data in a memory portion may indicate if the data stored in the portion is too sparsely distributed to provide enough contiguous, unused storage for future write operations. When performing garbage collection, a portion or sub-portion of valid data residing at a first physical address must be identified, reproduced in entirety in another physical location of memory identified by a second physical address, permitting the memory identified by the first physical address to be erased. Upon rewriting of the data to memory identified by the second physical address and erasure of the memory identified by the first physical address, a logical-to-physical table (e.g., L2P table 144) of all data in storage device 120 must be updated.

There are several techniques for performing garbage collection operations, and specifically for identifying the physical locations of valid data. For example, a storage device controller, such as storage controller 140, may be configured to continuously maintain a table or mapping of all physical-to-logical addresses of data written to memory 163 of each respective storage medium 160. For each write or rewrite operation of data at a respective storage medium 160, the storage medium 160 would communicate addressing information corresponding to the operation, to storage controller 140. While this technique may not be cumbersome for a small number of storage media 160 in a storage device 120, as the number of storage media 160 increases, the amount of data transferred between the storage controller 140 and all storage media 160 would create communication bandwidth and latency problems hindering other necessary communications between these components. This would also require constant storage of a large data structure of physical-to-logical memory mapping in control memory 143. Additionally, process circuitry 145 of storage controller 140 would be hindered by the computational requirements of maintaining such as physical-to-logical memory map or table.

An alternative technique requires each respective storage medium 160 to transfer the entire content of portions of memory 163 to storage controller 140 to extract addressing information from the portions. This also results in a computational burden for process circuitry 145 of storage controller 140, and a large transfer of data over communication channels between storage controller 140 and each respective storage medium 160. The majority of the data transferred is irrelevant to the task of obtaining addressing information, resulting in an inefficient use of communication resources. The various methodologies, implementations and embodiments described in the present disclosure address the limitations of these particular addressing techniques.

In some embodiments, memory 163 of each storage medium 160 is divided into a number of addressable and individually selectable blocks. In some implementations, the individually selectable blocks, sometimes called erase blocks, are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), however, the smallest individually accessible unit of memory set is a sub-page, which is a subunit of a page. That is, a block includes a plurality of pages, each page contains a plurality of sub-pages, and each sub-page is the smallest unit of memory for reading data from the flash memory device. For example, each block includes any number of pages, for example, 64 pages, 128 pages, 256 pages or another suitable number of pages. In another example, each block includes any number of sectors, for example, 64 sub-pages, 128 sub-pages, 256 sub-pages or another suitable number of sub-pages.

Memory 163 may be arranged as a two-dimensional (2D) memory array, or a three-dimensional (3D) array. In contrast to 2D memory arrays, which are generally formed along a planar surface of a semiconductor wafer, 3D arrays can generally extend up from the wafer surface and generally include stacks, or columns, of memory cells extending upwards (i.e., orthogonal to the wafer surface). Various 3D arrangements/architectures are possible, and examples of such 3D architectures and their formation are described in U.S. Pub. 2012/0220088 and in U.S. Pub. 2013/0107628, which are hereby incorporated by reference in their entirety.

FIG. 1 illustrates a non-volatile storage device 120 that may include one or more storage media 160 which may each include memory die or chips. Such die/chip(s) and/or memory controller 161, may be mounted or otherwise connected to one or more controller boards, such as printed circuit boards (PCBs) having certain circuitry, die/chips and/or discrete components mounted or otherwise connected thereto, for providing control functionality for the system. The term "board" is used herein according to its broad and ordinary meaning, and may refer to any type of board or substrate on which one or more chips or devices may be mounted. The memory 163 of storage medium 160 may include an array (two-dimensional or three dimensional) of solid-state memory cells. The memory cells may have a 3D memory (e.g., 3D NAND) configuration, or a 2D memory configuration.

In certain embodiments, the storage controller 140 and/or other control circuitry of the non-volatile storage device 120 (e.g., memory controller 161) may comprise hardware, firmware, or a combination of hardware and software or firmware. For example, storage controller 140 may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, storage controller 140 may comprise instructions executable with a processor or processor circuitry to implement one or more of the features of the storage controller 140. The storage controller 140 (which may be a flash memory device controller in certain embodiments) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller.

Storage Controller

Figure 2:
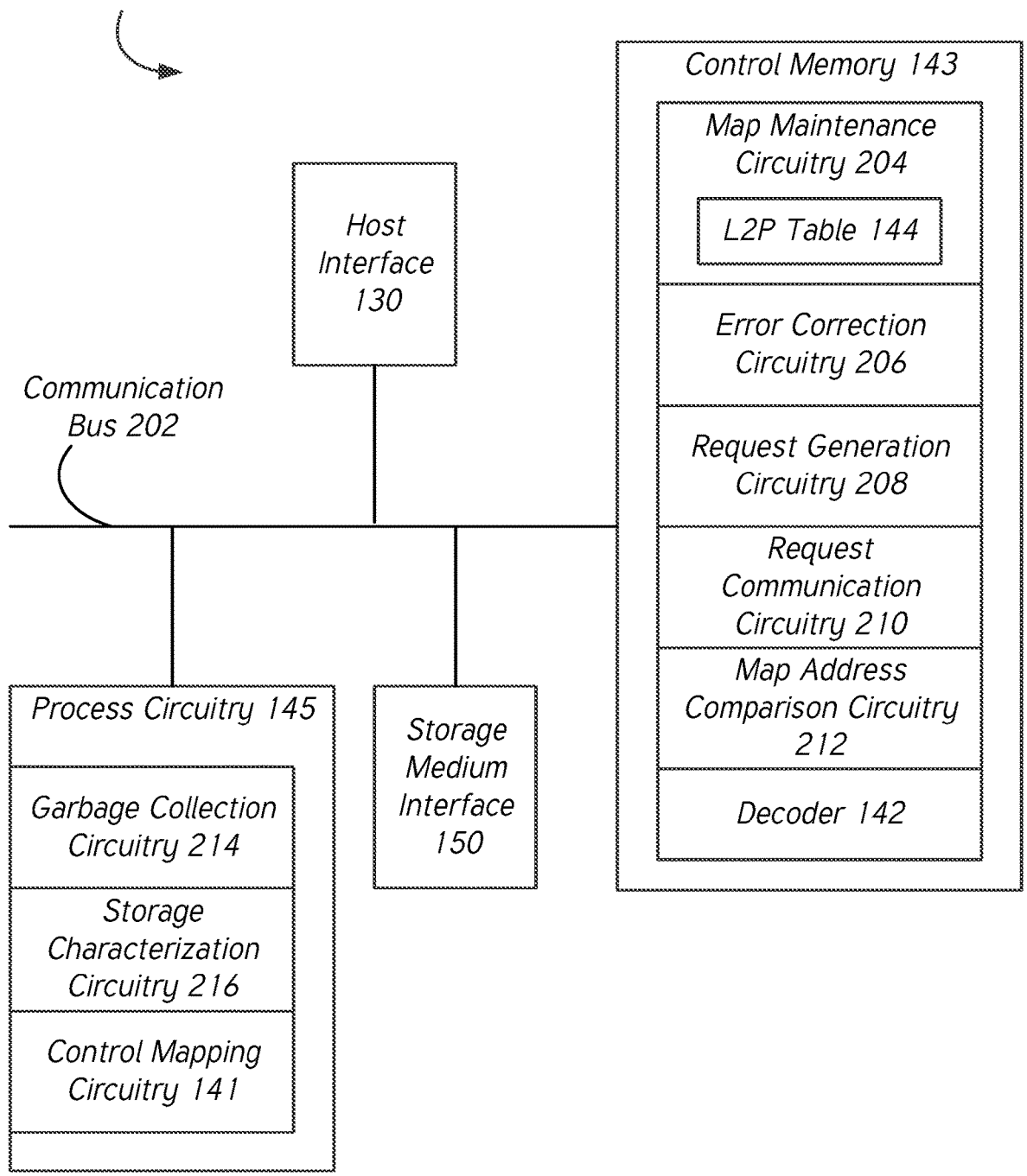
FIG. 2 is a block diagram illustrating an implementation of a storage controller of a storage device, in accordance with some embodiments.

FIG. 2 is a block diagram illustrating an implementation of storage controller 140 of the storage device 120 described with respect to FIG. 1, in accordance with some embodiments. In some embodiments, storage controller 140 includes process circuitry 145. Process circuitry 145 may include one or more processors (also sometimes called CPUs, hardware processors, microprocessors or microcontrollers) for executing modules, programs, processes and/or instructions stored in control memory 143 and thereby performing processing operations. Process circuitry 145 may include circuitry for performing specific processing operations. For example, process circuitry 145 may include garbage collection circuitry 214 for planning and executing garbage collection processes. In some embodiments, one or more garbage collection processes may be triggered by information received from circuitry and/or processes managing storage media (e.g., Flash Translation Layer (FTL)) on one or more units of memory in one or more storage media 160. In some embodiments, garbage collection circuitry 214 includes circuitry, processes and/or memory management mechanisms such as a flash translation layer (FTL). In some embodiments, the garbage collection circuitry 214 is itself a part of such circuitry, processes and/or memory management mechanisms (e.g., flash translation layer (FTL)).

Another aspect of process circuitry 145 may include implementation of storage characterization circuitry 216. Storage characterization circuitry 216 may be configured to determine and maintain characteristics of non-volatile memory of the entire storage device 120. For example, storage characterization circuitry 216 may keep track of the health parameters of respective memory die among the storage media 160. Such health parameters may include information about unresolvable errors in particular blocks of memory, how frequently data has been written to or read from particular blocks of memory and how efficiently data has been written to a particular block. In some embodiments, storage characterization circuitry 216 may rely on some of the same information, operations, data, modules or programs used by garbage collection circuitry 214. Garbage collection circuitry 214 may provide a means for performing garbage collection operations on a portion of a non-volatile memory die (e.g., by using validity map of valid logical addresses corresponding to physical addresses of the portion). In some embodiments, storage characterization circuitry 216 includes circuitry, processes and/or memory management mechanisms such as a flash translation layer (FTL). In some embodiments, storage characterization circuitry 216 is itself a part of such circuitry, processes and/or memory management mechanisms (e.g., flash translation layer (FTL)).

Process circuitry 145 may also include control mapping circuitry 141. In some embodiments, control mapping circuitry 141 is implemented to manage processing operations in process circuitry 145, related to determining and maintaining addressing information in one or more storage media 160. Control mapping circuitry 141 may be configured to coordinate information exchange among other circuits, such as garbage collection circuitry 214, as well as memory controller 161 of each respective storage medium 160. Control mapping circuitry 141 may also be configured to manage or implement one or more circuits, modules, programs or instructions in control memory 143, such as map maintenance circuitry 204. In some embodiments, control mapping circuitry 141 includes circuitry, processes and/or memory management mechanisms such as a flash translation layer (FTL). In some embodiments, the control mapping circuitry 141 is itself a part of such circuitry, processes and/or memory management mechanisms (e.g., flash translation layer (FTL)).

Control memory 143 (sometimes called storage controller memory or storage device controller memory), host interface 130 and storage medium interface 150 may all be interconnected with process circuitry 145 by one or more communication buses 202. Communication bus or buses 202 optionally include circuitry (sometimes called a chipset) that interconnects and controls communications between system components.

Control memory 143 of storage controller 140 may include high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Control memory 143 comprises a non-transitory computer readable storage medium. In some embodiments, control memory 143, or the non-transitory computer readable storage medium of control memory 143 stores one or more programs, circuits, modules, and data structures.

In some embodiments, control memory 143 of storage controller 140 includes map maintenance circuitry 204, which may further include some or all of a logical-to-physical (L2P) table (or map or listing) 144. In some embodiments, map maintenance circuitry 204 is configured to update logical-to-physical table 144 in response to receiving particular host commands (e.g., write commands or erase commands). In some embodiments, the functions of map maintenance circuitry 204 and control mapping circuitry 141 are performed in a single set of circuitry (e.g., only map maintenance circuitry 204 or control mapping circuitry 141). The logical-to-physical (L2P) table 144 may be updated after performance of a garbage collection operation. For example, if a page of valid data identified by a first physical address and a first logical address is rewritten to a memory location identified by a second physical address, the storage controller 140 may update L2P table 144 to associate the first logical address with the second physical address.

Control memory 143 may further include error correction circuitry 206. In some embodiments, error correction circuitry 206 is configured to detect and attempt to correct erroneous addressing information corresponding to a portion of memory in one or more storage media 160 (e.g., as shown in FIG. 1). Error correction circuitry 206 may be configured to use one or more known error detection and/or error correction techniques. In some embodiments, error correction circuitry 206 is configured to enable error detection and/or error correction operations on addressing information of a portion of memory, received by storage controller 140 from the memory controller 161 of a respective storage medium 160. Error correction circuitry 206 may be configured to determine that a logical address in a physical-to-logical mapping is corrupted, to retrieve error correction information corresponding to the corrupted logical address and/or generate a corrected value of the determined corrupted logical address, using the error correction information. In some embodiments, error correction circuitry 206 is configured to enable correction on any data received from a respective storage medium 160.

In some embodiments, control memory 143 further includes request generation circuitry 208. Request generation circuitry 208 may be configured to generate an addressing or mapping request, for transmission to a storage medium (e.g., storage medium 160, FIG. 1). An addressing or mapping request may include instructions for a storage medium (or control circuitry thereof), to return specific physical addressing information with corresponding logical addressing information. For example, a mapping request generated by request generation circuitry 208 may include instructions for a storage medium 160-1 of FIG. 1 to obtain and return a table of all the physical addresses of all the sub-pages of a particular block of memory in non-volatile memory 163-1, along with a respective logical address for each respective physical address, if there is data written to a respective sub-page. In some embodiments, a mapping request is a subset of an addressing request. For example, an addressing request may include more information than a mapping request. In some embodiments an addressing request includes a mapping request. For example, an addressing request may originate from a host (e.g., host system 110) to determine a proportion of a set of physical addresses associated with a valid logical address, while a mapping request may originate from a storage controller (e.g., storage controller 140) to obtain a one-to-one association of physical addresses to respective logical addresses in a particular portion of memory. An addressing request may include any command, instruction, demand, signal, or indication provided by a logic device (e.g, host) external to a memory die. In addition, an addressing request may include a command or request for any address information, such as address mapping information, physical address to logical address mapping information, or any other indication of a relationship between physical addresses and logical addresses in one or more portions of memory.

Request generation circuitry 208 may be configured to format the addressing or mapping request as a single line command. This single line command, may otherwise be referred to as a NAND command, an atomic command and/or a self-contained command. The single line command may be configured to be interpreted by a storage medium (or control circuitry thereof), to perform a set of operations based on a predefined method, class, template, implementation or other instruction set identified and/or invoked by a name. In some embodiments, the addressing or mapping request is configured to take one or more inputs as part of the request and/or command. These inputs may include a portion indicator (e.g., physical address) for a particular memory portion (e.g., memory block) and a number of sub-portions (e.g., pages or sub-pages) of the memory portion to parse for addressing information.

The addressing or mapping request may further be configured to identify a format for a response to the request and/or command. For example, the mapping request may include a single line command invoking a predefined set of instructions for obtaining addressing information of a plurality of sub-portions of a memory portion, and returning a string of addresses (logical and/or physical) for the plurality of sub-portions. The mapping request may be configured to have default behavior in case one or more inputs are not provided in the invocation or generation of the mapping request. For example, if a number of sub-portions to parse for addressing information is not provided in the mapping request, the mapping request may be interpreted to correspond to a default value for the number of sub-portions (e.g., all the sub-pages of an identified block).

Control memory 143 may further include request communication circuitry 210, configured to communicate addressing or mapping requests with one or more storage media (e.g., storage medium 160 of FIG. 1), and receive or otherwise obtain responses to the addressing or mapping requests. In some embodiments, request communication circuitry 210 is configured to work in tandem with storage medium interface 150, specifically for addressing-related communications. In some embodiments, request communication circuitry 210 is configured to forward an addressing request or mapping request generated by a host, to a storage medium. Similarly, request communication circuitry 210 may be configured to receive and forward directly to a host, a response to an addressing or mapping request. In some embodiments, request communication circuitry 210 is configured to work in tandem with host interface 130, specifically for addressing-related communications received directly from a host, or directed to the host.

In some embodiments, control memory 143 includes map address comparison circuitry 212. Map address comparison circuitry 212 may be configured to perform a validity analysis, as described in greater detail with respect to FIG. 4. In some embodiments, map address comparison circuitry 212 is involved in comparing addressing information received from one or more storage media, with a master listing of addressing information, such as logical-to-physical (L2P) table 144. Map address comparison circuitry 212 may also be configured to generate a validity map, or modify addressing information received from a storage medium, to identify or remove invalid addresses. The validity map may be used, for example, by garbage collection circuitry 214. In some embodiments, map address comparison circuitry 212 provides a means for determining validity of each respective physical address stored in the physical-to-logical mapping and a means for creating a validity map of valid physical addresses of the portion.

Control memory 143 may further include decoder 142. Decoder 142 may be used to decode addressing information into physical and/or logical addresses. For example, in some embodiments, a storage medium may have a sub-portion of memory with erroneous addressing information. The storage medium may send the entire set of data corresponding to that sub-portion to storage controller 140 for purposes of error correction. In some embodiments, error correction circuitry 206 may use decoder 142 to attempt to decode the physical address of a sub-portion of memory before performing error correction operations.

Storage Media

FIG. 3 is a block diagram illustrating an implementation of storage medium 160 described with respect to FIG. 1, in accordance with some embodiments. Storage medium 160 may include storage controller interface 301 for communicating with and interfacing with storage controller 140 (e.g., a storage device controller or storage device control circuitry) of a storage device comprising one or more storage media 160.

In some embodiments, storage medium 160 includes memory controller 161. Memory controller 161 may include one or more processors (also sometimes called CPUs, hardware processors, microprocessors or microcontrollers) for executing modules, programs and/or instructions stored in memory 163 and thereby performing processing operations. Memory controller 161 may include circuitry for performing specific processing operations. For example, memory controller 161 may include storage mapping circuitry 162. In some embodiments, storage mapping circuitry 162 is configured to manage processing operations in memory controller 161, related to determining addressing information for units of memory in memory 163. Storage mapping circuitry 162 may be configured to coordinate information exchange with storage controller 140 of a storage device comprising one or more storage media 160. Storage mapping circuitry 162 may also be configured to manage or implement one or more circuits, modules, programs or instructions in memory 163, such as addressing information generation circuitry 308.

Memory 163 (sometimes called non-volatile memory or NVM die memory) and storage controller interface 301 may be interconnected with memory controller 161 by one or more communication buses 302. Communication bus or buses 302 optionally include circuitry (sometimes called a chipset) that interconnects and controls communications between system components.

Memory 163 of storage medium 160 may include high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 163 comprises a non-transitory computer readable storage medium. In some embodiments, memory 163, or the non-transitory computer readable storage medium of memory 163 stores one or more programs, circuits, modules, and data structures. It should be understood that the principles disclosed herein are applicable to other solid-state memory architectures, including 3D memory devices and architectures (e.g., 3D NAND).

In some embodiments, memory 163 of storage medium 160 includes request communication circuitry 304. Request communication circuitry 304 may be configured to receive or obtain addressing or mapping requests from storage controller 140 of a storage device comprising one or more storage media 160. In some embodiments, request communication circuitry 304 is configured to work in tandem with storage controller interface 301, specifically for addressing-related communications. In some embodiments request communication circuitry 304 is configured to receive an addressing or mapping request from storage controller 140. Request communication circuitry 304 may be configured to read a mapping request for a portion indicator (e.g., physical address) corresponding to a portion (e.g., block) of a respective storage medium (e.g., non-volatile memory die), at which to start extracting addressing information.

Memory 163 may further include address decoder 306. In one embodiment, the address decoder 306 decodes addressing information into physical addresses. For example, in some embodiments, addressing information is encoded. As such, to perform operations such as parsing sub-portions of memory in memory 163 to obtain a physical to logical address mapping, address decoder 306 may first decode the encoded physical addressing information. In some embodiments, a physical address of a page (or other unit) of memory may be determined by de-multiplexing addressing information corresponding to the page, using address decoder 306.

In some embodiments, memory 163 includes address information generation circuitry 308, which may further include physical-to-logical table 164. Address information generation circuitry 308 may be configured to respond to a received addressing or mapping request from storage controller 140, by generating addressing information corresponding to a particular memory portion or set of memory sub-portions of memory 163. For example, address information generation circuitry 308 may receive from request communication circuitry 304 a mapping request to return a physical-to-logical address mapping for a particular block, and 256 pages of the block. Address information generation circuitry 308 may be configured to read the contents of memory 163 to find an identified memory portion (e.g., block) from an addressing or mapping request. The memory portion may be identified by a physical address, and the contents of memory 163 may be contiguous on the basis of physical addressing. Address information generation circuitry 308 may be further configured to read or parse each sub-portion of the identified memory portion for possible logical address information to copy to a physical-to-logical table 164. Address information generation circuitry 308 may be configured to work in tandem with address decoder 306 to decode logical addressing information. Address information generation circuitry 308 may be configured to read logical addressing information from the header of a respective sub-portion of memory. In addition, addressing information generation circuitry 308 may be configured to format the addressing information as a particular data type (e.g., string, bitmap), and format the addressing information in a particular way for optimized reading by the storage controller or host.

In some embodiments, address information generation circuitry 308 includes additional circuitry, such as memory parser 307 and/or mapping generation circuitry 309. Memory parser 307 may comprise circuitry communicatively coupled to a plurality of memory portions of memory 163. For example, memory parser 307 may comprise one or more data storage registers or devices, logic circuits, communication paths or busses, processing circuitry comprising one or more processors, power sources, and/or the like. Memory parser 307 may be configured to read or parse each sub-portion of the identified memory portion for possible logical address information to copy to a physical-to-logical table 164. For example, memory parser 307 may be configured to identify a header of a respective sub-portion of memory, analyze the information in the header, and/or extract relevant information from the header, such as logical addressing information. In some embodiments, mapping generation circuitry 309 may be configured to assemble extracted addressing information from respective sub-portions of memory into a physical-to-logical mapping or table, such as physical-to-logical table 164. Memory parser 307 may provide a means for reading a respective sub-portion of a portion of a respective non-volatile memory die. In one embodiment, mapping generation circuitry 309 is circuitry communicatively coupled to a plurality of memory portions of memory 163. For example, mapping generation circuitry 309 may comprise one or more data storage registers or devices, logic circuits, communication paths or busses, processing circuitry comprising one or more processors, power sources, and/or the like. Mapping generation circuitry 309 may further be configured to format the addressing information as a particular data type (e.g., string, bitmap), and format the addressing information in a particular way for optimized reading by the storage controller or host. Mapping generation circuitry 309 may also be configured to generate a mapping of physical and logical addresses, indexed by contiguous physical addresses (e.g., in increasing or decreasing order of physical address). Mapping generation circuitry 309 may provide a means for storing a logical address with a respective physical address, and may further provide a means for storing a logical address with a respective physical address in a physical-to-logical table, in accordance with a determination that the logical address does not have one or more errors. Mapping generation circuitry 309 may also provide a means for retrieving a logical address stored in the respective sub-portion, identified by a respective physical address.

In some embodiments, error correction circuitry 310 of memory 163 is configured to detect and attempt to correct erroneous addressing information corresponding to a portion of memory 163 identified in an addressing or mapping request received from storage controller 140. Error correction circuitry 310 may be configured to use one or more known error detection and/or error correction techniques to provide corrected addressing information in physical-to-logical table 164. In some embodiments, error correction circuitry 310 is configured to flag one or more detected errors in the physical-to-logical table 164. Error correction circuitry 310 of memory 163 may be further configured to work in tandem with error correction circuitry 206 of storage controller 140. Error correction circuitry 310 may provide a means for determining if a logical address has one or more errors. In some embodiments, error correction circuitry 310 provides a means for identifying an erroneous value of the logical address in the physical-to-logical table. Error correction circuitry 310 may be configured to determine that a logical address in a physical-to-logical mapping is corrupted, to retrieve error correction information corresponding to the corrupted logical address and/or generate a corrected value of the determined corrupted logical address, using the error correction information.

In some embodiments, memory 163 of storage medium 160 includes address communication circuitry 312. Address communication circuitry 312 may be configured to transmit or provide responses to the addressing or mapping requests. In some embodiments, address communication circuitry 312 is configured to work in tandem with storage controller interface 301, specifically for addressing-related communications. In some embodiments address communication circuitry 312 is configured to address and forward to a host (e.g., through storage controller 140), a response to an addressing or mapping request.

Storage Device Controller-Generated Addressing Requests

Figure 4:
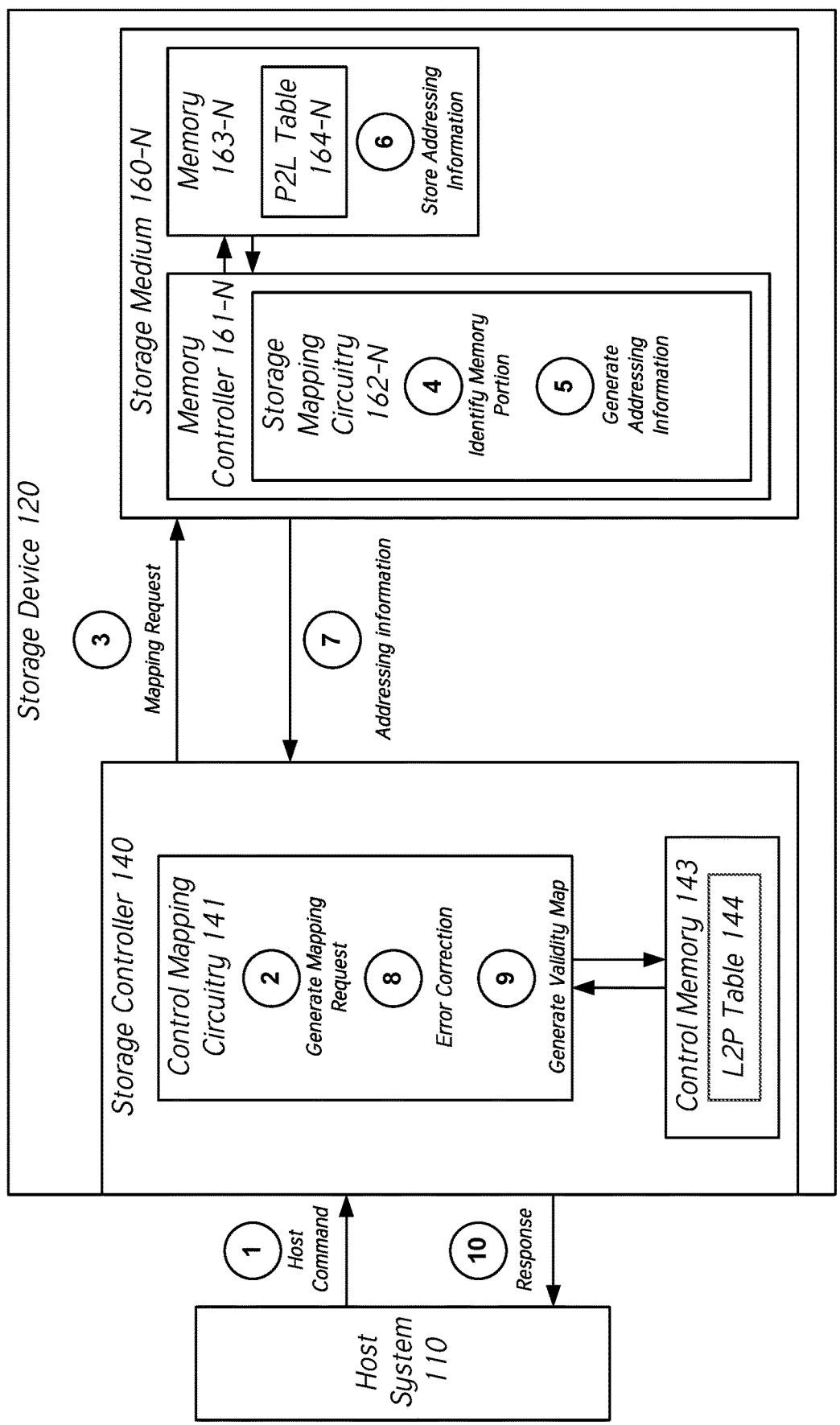
FIG. 4 is a block diagram illustrating generation, transmission and response to a request for addressing information in accordance with one or more embodiments.

FIG. 4 is a block diagram illustrating generation, transmission and response to a request for addressing information in accordance with one or more embodiments. In some embodiments, as depicted by event 1, a host (e.g., host system) 110 transmits a host command to storage device 120. More specifically, host 110 may transmit the host command to the host interface (not shown), of storage controller 140, as described above with respect to FIG. 1. In some embodiments, control mapping circuitry 141 (e.g., of process circuitry 145, or standalone within storage controller 140), generates a mapping request, depicted as event 2. FIG. 4 illustrates an embodiment where control or processing circuitry of storage device 120 that is in direct communication with host 110, namely storage controller 140, generates a mapping request in response to a particular host command or commands. In some embodiments, storage controller 140 is distinguished from host 110 and from memory controller 161, by being coupled (e.g., communicatively and/or electrically) to each of host 110 and storage media 160. As such, in some embodiments, operations or processes performed by storage controller 140 may be in response to receiving one or more host commands from host 110. Additionally, in some embodiments, operations or processes performed by storage controller 140 may be in response to receiving one or more communications from storage media 160.

As shown in FIG. 4, in some embodiments, storage controller 140, communicatively coupled to storage medium 160-N (and potentially other storage media 160), transmits the generated mapping request to storage medium 160-N, as represented by event 3. Storage medium 160-N may include interfacing circuitry to receive the mapping request. Additionally, or alternatively, the mapping request may be received at memory controller 161-N of storage medium 160-N. In some embodiments, storage medium 160-N is a semiconductor die, and memory controller 161-N is processing circuitry (e.g., including a processor and/or controller) for the semiconductor die (e.g., a die-level controller). In some embodiments, memory controller 161 of a storage medium 160 is distinguished from host 110 and from storage controller 140, by only being coupled to storage controller 140 of storage device 120. In this example, memory controller 161 is not directly coupled to host 110.

In some embodiments, the mapping request is received at storage mapping circuitry 162-N of memory controller 161-N, and the mapping request is read. The mapping request may be read to identify a memory portion associated with the request, depicted as event 4. Reading the mapping request may include identifying other information, such as an instruction for performing an operation (e.g., extracting physical and logical addressing information in memory 163-N), how many sub-portions on which to perform the action (e.g., to parse all pages of a block for addressing information) and/or actions to take in case an error is detected in the performance of the action (e.g., flag error, fix error, etc.).

The memory controller 161-N, or the storage mapping circuitry 162-N thereof, may proceed to perform the one or more operations associated with the mapping request. In this example, event 5 depicts generation of addressing information or a map or mapping of physical addresses of the memory portion identified in event 4. In this example, memory controller 161-N is communicatively coupled to memory 163-N. Additionally, or alternatively, storage mapping circuitry 162-N may be communicatively coupled to memory 163-N. Generation of the map or addressing information is described in greater detail with respect to FIGS. 6A and 6B. However, in some embodiments, memory controller 161-N and/or storage mapping circuitry 162-N reads particular sub-portions (e.g., pages or sub-pages) of a memory portion (e.g., erase block), detects logical addressing information for a respective sub-portion, and optionally decodes the logical addressing information to determine a respective logical address for the respective sub-portion.

In some embodiments, storage mapping circuitry 162-N, or memory controller 161-N of storage medium 160-N compiles the detected logical addressing information and/or decoded logical addresses into a data structure for transmission to storage controller 140. In some embodiments, the logical addressing information and/or set of logical addresses is compiled with corresponding physical addressing information and/or physical addresses for each respective sub-portion of memory. The compiled addressing information may take any of several formats. For example, the compiled addressing information may be in the form of a table, matrix, array or other multi-variable data structure to indicate physical addressing information corresponding to particular logical addressing information. The compiled addressing information may be in the form of a string. In some embodiments, the physical addresses of sub-portions of memory are interpreted to be contiguous from a particular physical address corresponding to the first sub-portion of the identified memory portion from the mapping request. The compiled addressing information may be referred to as a map or mapping information. One such format of this addressing information is a physical-to-logical (P2L) table 164-N, shown as being stored in memory 163-N. Storage mapping circuitry 162-N may store P2L Table 164-N in memory 163-N after generating the compiled addressing information, as depicted by event 6. This compiled addressing information may then be transmitted to storage controller 140 as depicted by event 7.

As illustrated by events 3 to 7, storage controller 140 (e.g., coupled to host 110), can efficiently obtain desired addressing information from a portion of memory 163-N of storage medium 160-N. While FIG. 4 illustrates a single storage medium 160-N interfacing with storage controller 140, a storage device 120 may have a large plurality of storage media 160, each coupled to storage controller 140. As such, generation of addressing information for portions of memory at memory controller 161 of each respective storage medium 160, reduces transmission of information to storage controller 140. Rather than sending all the contents of the portion of memory (e.g., addressing information as well as data) to storage controller 140 to parse, decode and compile for addressing information, memory controller 161 performs those operations and transmits only the resulting addressing information required by storage controller 140. As such, storage controller 140 is configured to obtain physical-to-logical addressing information of a respective portion of memory of a respective storage medium 160, without reading, parsing, decoding or extracting the logical addressing information from the portion of memory itself.

Error Correction at Storage Controller

Error correction of the addressing information is an important aspect of proper conveyance of addressing information. In some embodiments, error correction of the addressing information corresponding to the memory portion of the mapping request, is performed at storage controller 140, as depicted by event 8. More specifically, the error correction may be performed by control mapping circuitry 141 of storage controller 140. In other embodiments, error correction may be performed at a respective storage device 160, such as by memory controller 161 and/or storage mapping circuitry 162. Error correction may also be performed partially by memory controller 161 and partially by storage controller 140.

In some embodiments, an aspect of error correction of the addressing information is detecting and correcting for corruption of the transmitted data structure itself (e.g., a string or bitmap of addressing information). For example, a string of addressing information generated by memory controller 161-N may be free of errors, but in the process of transmission to storage controller 140, may experience data corruption. For this type of error correction, generation of the addressing information would require including error correction information, to allow for recovery by storage controller 140.

Another source of erroneous information is at the level of each sub-portion of the identified portion of memory in the mapping request. For example, a respective sub-portion of memory (e.g., a sub-page) may include corrupted addressing information. In some embodiments, a sub-portion of memory includes error correction information (e.g., of any known error correction techniques), in the data of the sub-portion of memory. Where the storage controller 140 performs error correction operations, memory controller 161-N may transmit all the contents of the sub-portion, and/or all the contents of all sub-portions of the portion to storage controller 140 to correctly determine the addressing information for the erroneous sub-portion.

Validity Analysis

Another function that may be performed by storage controller 140 and/or control mapping circuitry 141, is determining "validity" of the addressing information. For example, a logical address may be written to a particular sub-portion of memory identified by a respective physical address. This association between the physical address and logical address may not exist anymore, in a logical-to-physical table 144, stored at control memory 143 of storage controller 140. In this example, storage controller 140 maintains a universal table 144 of logical to physical addresses across all storage media 160 of storage device 120. In this maintenance, logical addresses may be dissociated from particular physical addresses, and/or associated with other physical addresses. This may be in response to host commands such as write commands or erase commands. As a result, addressing information received by storage controller 140 from one or more storage media 160, may not be erroneous or contain corruptions, but may be invalid due to an updating or erasure of the logical address written to a particular sub-portion. Determining validity of data stored to a particular physical address may be of importance in the execution of one or more operations such as garbage collection, where valid data is assigned for relocation away from blocks scheduled for erasure.

In some embodiments, storage controller 140 and/or control mapping circuitry 141 generates a validity map, depicted as event 9 in FIG. 4. Generating this validity map may include comparing entries in the addressing information received from a respective storage medium 160 (e.g., a physical-to-logical mapping), to entries in logical-to-physical table 144. If there is a mismatch of a physical address for a respective logical address found in the two sets of information, the logical address corresponding to the physical address in the addressing information received from a storage medium 160, is considered invalid. In some embodiments, in response to determining invalidity of an address, the storage controller 140 (or control mapping circuitry 141) erases the logical addressing information corresponding to the conflicting physical address in the addressing information received from the storage medium 160. Additionally, or alternatively, the logical addressing information corresponding to the conflicting physical address in the addressing information received from the storage medium 160 is marked as having invalid information.

In the example shown in FIG. 4, storage controller 140 of storage device 120 may transmit to host 110, a response. In some embodiments, the response is identified as being responsive to the corresponding host command received from the host, as depicted by event 1. The identifying information linking the response and the host command may be included in the response. In some embodiments, the host command requests mapping information of a particular portion of memory (e.g., to make an assessment for purposes of garbage collection), and the response includes the mapping information (e.g., after error correction and/or validity analysis). In some embodiments, the host command requests performance of an operation involving the obtained mapping information, such as a garbage collection command on one or more portions of memory within storage device 120. In this example, storage controller 140 may proceed to perform known garbage collection operations after determining a final, valid mapping of physical to logical addresses in one or more portions of memory. As such, the corresponding response to the host command may be a confirmation of performance of the requested operation.

Host-Generated Addressing Requests

Figure 5:
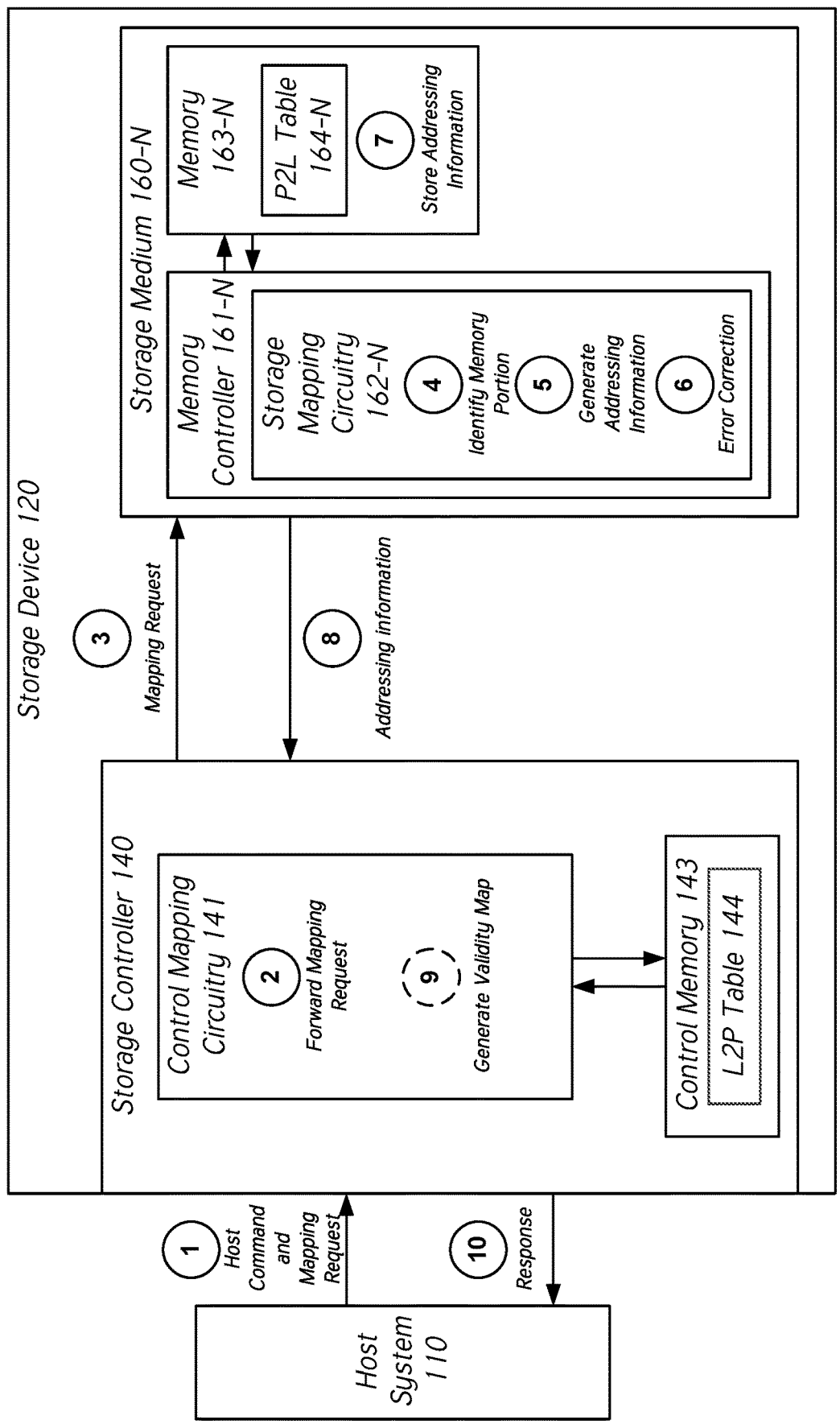
FIG. 5 is a block diagram illustrating generation, transmission and response to a request for addressing information in accordance with one or more embodiments.

FIG. 5 is a block diagram illustrating generation, transmission and response to a request for addressing information in accordance with one or more embodiments. In this example, host 110 transmits a host command comprising a mapping request, as depicted by event 1. This is in contrast to the example shown in FIG. 4, where the mapping request was generated by storage controller 140 in response to receiving the host command. In this example, storage controller 140 acts as a forwarding engine for transmitting the mapping request of the host command to a storage medium 160 associated with the mapping request, as depicted by event 2. For example, the host command may entirely consist of the mapping request, and expect addressing information as a response. In another example, the host command includes the mapping request as a part of a larger set of instructions or request for performance. The mapping request may be included with a request to perform garbage collection operations on one or more storage media 160 within storage device 120.

Storage controller 140 may transmit the mapping request to the appropriate storage medium 160 (e.g., storage medium 160-N), as depicted by event 3. In some embodiments, storage controller 140 reads the received host command comprising the mapping request, to determine which storage medium 160 of storage device 120, to forward it to.

As shown in storage mapping circuitry 162-N of storage medium 160-N, in some embodiments a memory portion within memory 163-N is identified from the received mapping request, as depicted by event 4. Further details of this operation are described above with respect to FIG. 4. Subsequently, addressing information (e.g., a map of physical to logical addresses) in the identified memory portion is generated, as depicted by event 5. Additional details of the generation of the addressing information are provided above with respect to FIG. 4 and below with respect to FIGS. 6A-6B and 7.

Error Correction at Memory Controller

FIG. 5 illustrates that in some embodiments, at least a subset of error correction operations is performed at a storage medium 160, such as by memory controller 161 or storage mapping circuitry 162, as depicted by event 6. In this example, and as described above with respect to FIG. 4, errors may be detected in the logical addressing information of a respective sub-portion of memory in memory 163-N. In some embodiments, error correction includes error identification and/or error indication. For example, memory controller 161 and/or storage mapping circuitry 162 are configured to check a flag in the set of addressing information compiled for transmitting back to host 110. Additionally or alternatively, storage mapping circuitry 162-N is further configured use known techniques to recover the logical address of a respective sub-portion identified by a physical address. This may include using error correction data stored in the sub-portion. As described above with respect to FIG.

4, the addressing information (e.g., physical-to-logical table 164-N or map) may be stored to memory 163-N, and depicted by event 7.

In some embodiments, in response to receiving the mapping request at the storage medium 160-N from host 110, memory controller 161 and/or storage mapping circuitry 162-N transmits the generated addressing information, which may also have been checked for errors, to storage controller 140. This is depicted as event 8. While in this example, the addressing information is sent to storage controller 140, it is generated for responding to the corresponding host command and/or mapping request of event 1, from host 110. As such, in some embodiments, storage controller 140 and/or control mapping circuitry 141 acts as a forwarding engine for conveying the received addressing information from memory controller 161-N to host 110.

As shown in FIG. 5, the addressing information received from storage medium 160-N at storage controller 140 may optionally be checked by storage controller 140 and/or control mapping circuitry 141 for validity with respect to logical-to-physical table 144, as depicted by event 9. Additional aspects of this validity analysis are provided above with respect to FIG. 5. Finally, a response may be transmitted by storage controller 140 to host 110, as depicted by event 10.

Memory Portions

FIG. 6A is a block diagram representing a memory portion 600 in accordance with one or more embodiments. In some embodiments, memory portion 600 is a block, or erase block of memory within memory 163 of a storage medium 160, as described above with respect to FIGS. 1, 3, 4 and 5. A memory portion 600 may comprise more than one block or erase block of memory, and in some embodiments a memory portion 600 is smaller than a block or erase block of memory. As shown in the block diagram, memory portion 600 may have further divisions 602 of memory. For example, a division of memory in this case may be a page, such as pages 0 to 255 of a block comprising 256 pages. Each division may further be divided as shown by the columns in the representation of memory portion 600. As such, memory portion 600 may include smaller, individually addressable units of memory, such as sub-portion 604 (e.g., a sub-page). Each individually addressable unit of memory may be identified by a respective physical address. A physical address of an individually addressable unit of memory may be written to a header of the unit of memory (e.g., header of a sub-page or sub-portion). FIG. 6A also illustrates that each sub-portion 604 may include a logical address 606. In this example, the sub-portions of memory without a logical address 606 may not contain data written to them, and therefore would not need to have data transferred from them in the execution of garbage collection operations. While the example described with respect to FIG. 6A illustrates a 2-D embodiment of non-volatile memory addressing. It should be understood that the principles disclosed herein are applicable to other solid-state memory architectures, including 3D memory devices and architectures (e.g., 3D NAND).

Addressing Information

FIG. 6B is a block diagram of a table 610 of addressing information in accordance with one or more embodiments. Table 610 corresponds to the information in memory portion 600 of FIG. 6A. For example, entry 612, at the top of table 610, comprises logical address 1000 from the sub-portion of memory portion 600 corresponding to the first one read from the top right corner (e.g., sub-portion 604). In some embodiments, table 610 is a physical-to-logical mapping or physical-to-logical table of addresses. Table 610 may also be described as comprising addressing information corresponding to memory portion 600. In some embodiments, the entries in table 610 are ordered in sequence from the first physical address of a respective memory portion 600 (e.g., memory block) to the last physical address of the memory portion 600. For example, if memory portion 600 is an erase block comprising 256 pages and 1024 individually addressable sub-pages, table 610 comprises 1024 entries (as shown), in sequential order of the sub-pages.

In some embodiments, table 610 does not include entries for actual physical addresses of the sub-portions of memory. The relative position of an entry within table 610 may be enough to provide physical addressing information if the physical address of the first sub-portion of memory portion 600 is known, for example. As such, table 610 may be transmitted as a very condensed set of information. FIG. 6B also illustrates that an entry such as a reserved codeword (e.g., FFFF) or improperly formatted logical address (e.g., comprising an extra digit) may indicate an empty sub-portion of memory portion 600. In some embodiments, a first indicator, such as a reserved codeword (e.g., FFFF) indicates an empty entry in table 610 for a logical address, and a second indicator indicates an erroneous entry for a logical address. Additional indicators may be included to provide additional information, such as, but not limited to, a failed attempt to recover erroneous logical addressing information of a sub-portion, a successful attempt to recover erroneous logical addressing information of a sub-portion and age of the information stored in the sub-portion. As described above with respect to FIG. 5, in some embodiments, memory controller 161 and/or storage mapping circuitry 162 of a storage medium may perform one or more error correction operations on any erroneous logical addressing information before compiling table 610.

In some embodiments, the information of table 610 is compiled and transmitted as a string to storage controller 140. This compact format of data transmission may allow for conveying the requested addressing information in a resource-efficient manner. Other data structures may be used to transmit the addressing information of table 610, such as, but not limited to, a matrix, array, list or file. The data structure comprising the addressing information of table 610 may include a physical address for one or more entries. For example, the physical address of the first entry (e.g., first identified sub-page) in table 610 may be included in the data structure.

Memory Sub-Portion

Figure 7:
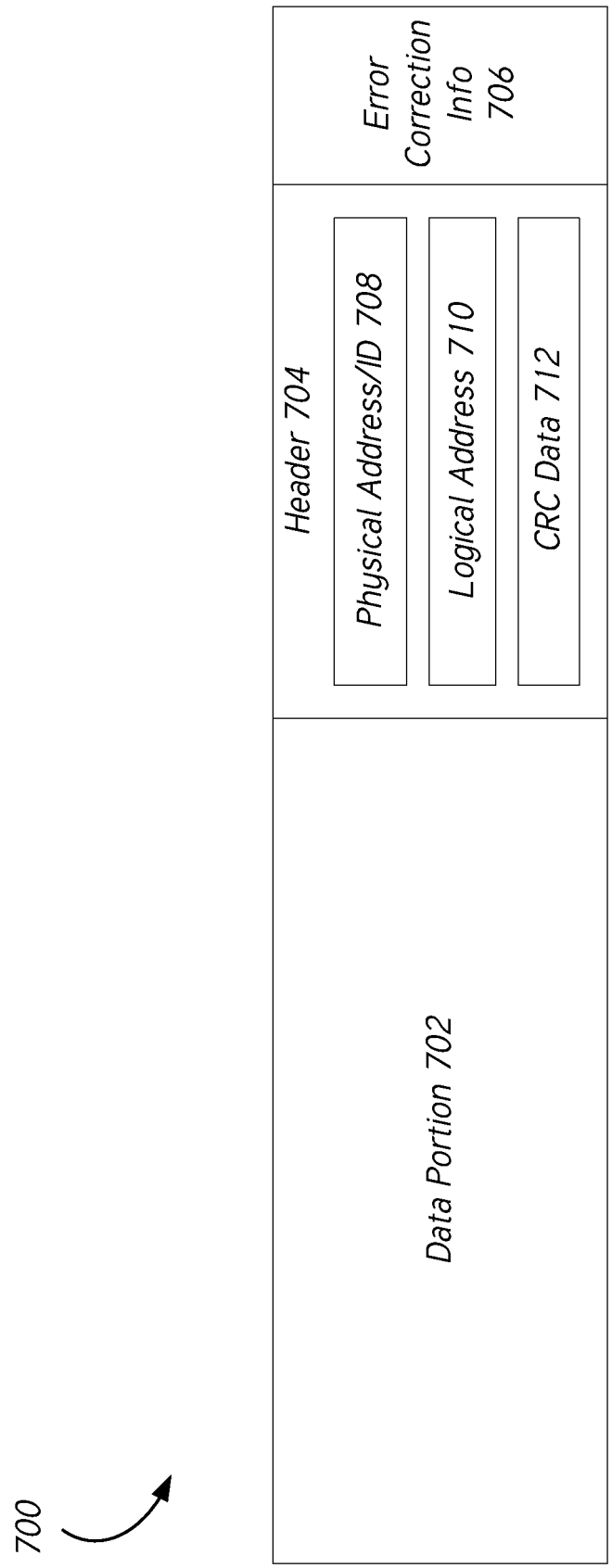
FIG. 7 is a block diagram of the contents of a sub-portion of memory according to one or more embodiments.

FIG. 7 is a block diagram of the contents of a sub-portion 700 of memory according to one or more embodiments. As shown in FIG. 7, sub-portion 700 may include some or all of a data portion 702, a header 704 and error correction information 706. In some embodiments, a sub-portion 700 may be identified by a physical address or identifier 708. This physical address or identifier 708 may be stored in the header 704 of sub-portion 700. All sub-portions 700 may be ordered in physical sequence within a memory portion, on the basis of physical address or identifier 708.

FIG. 7 further illustrates that sub-portion 700 may include a logical address or addressing information 710. In this example, logical address 710 may also be stored in header 704 of sub-portion 700. In some embodiments, a write operation of data to data portion 702 includes writing a corresponding logical address 710 to header 704. This writing may be performed by storage control circuitry (e.g., memory controller 161 described above with respect to FIGS. 1, 3, 4 and 5), in tandem with instructions from a host or storage device control circuitry (e.g., host 110 or storage controller 140 described above with respect to FIGS. 1, 2, 4 and 5).

Figure 8:
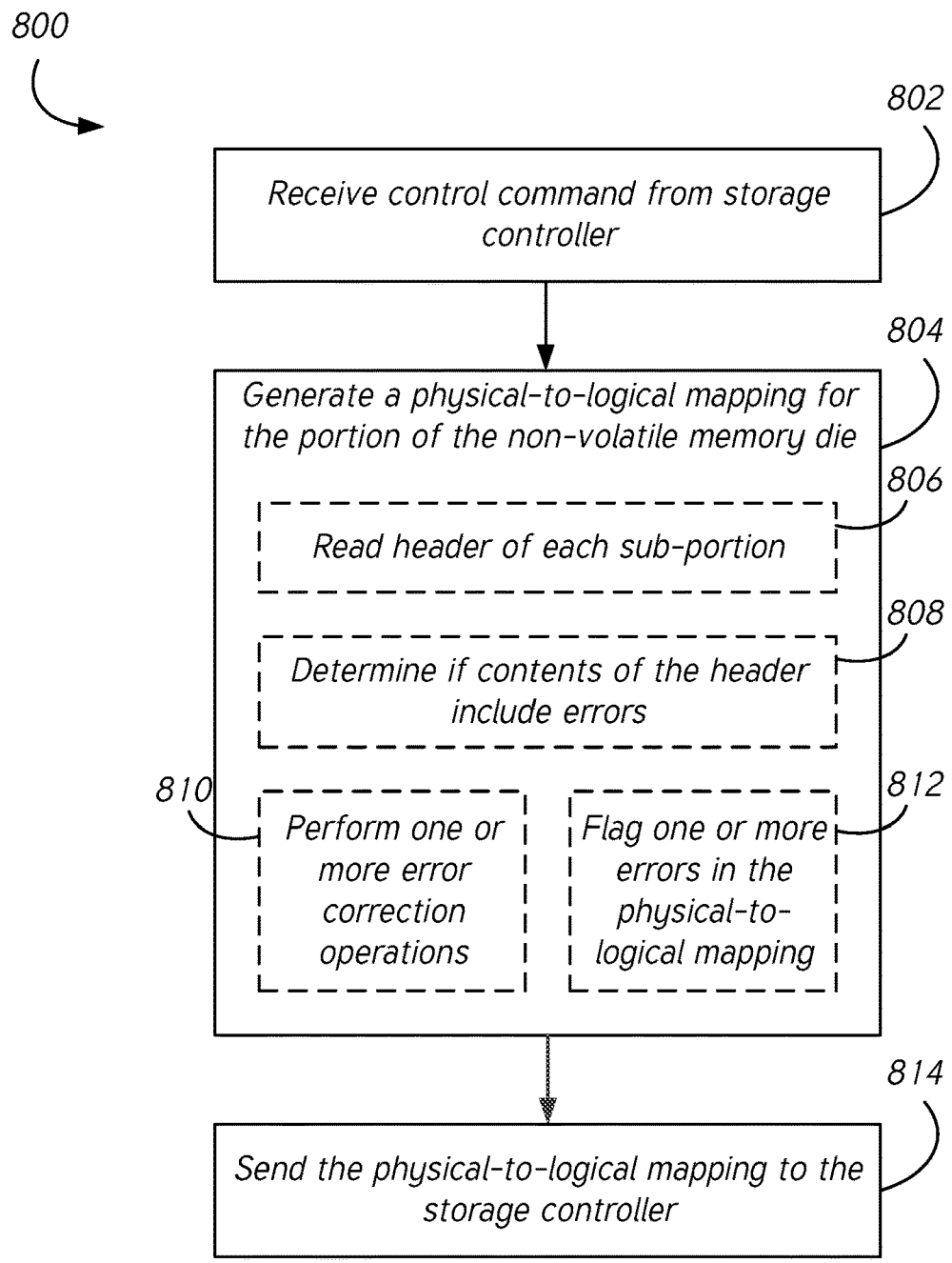
FIG. 8 is a flow diagram illustrating a process for providing addressing information corresponding to a portion of memory, in accordance with one or more embodiments.

Additionally, sub-portion 700 may comprise cyclic redundancy check (CRC) data 712, to determine if any data corruption occurred at sub-portion 700. In some embodiments, CRC data 712 may be used along with error correction information 706 to recover data in data portion 702, and/or logical address 710. In some embodiments, physical address or identifier 708 is able to be determined despite data corruption due to the physical location of sub-portion 700 among the sub-portions in a memory portion. Logical address 710 is not determinable in this manner, and may require performing one or more known error correction techniques on the contents of sub-portion 700 to determine.
Processes FIG. 8 is a flow diagram illustrating a process 800 for providing addressing information corresponding to a portion of memory, in accordance with one or more embodiments. Process 800 may be performed, for example, by control circuitry of a storage medium, such as memory controller 161 of a storage medium 160, as described herein. The process may be performed, in another example, by a memory die controller of a storage device, coupled to a storage controller (e.g., storage controller 140) and/or control circuitry of the storage device. By executing various addressing operations at a storage medium, process 800 may provide reductions in bandwidth usage and performance improvements, particularly at control circuitry of a storage device.

As represented by block 802, process 800 includes receiving a control command from a storage controller. For example, as depicted in FIG. 4, the control command may be the mapping request received by memory controller 161-N from storage controller 140. In this example, a storage controller is communicatively coupled to a host, as well as the storage control circuitry of a storage medium, such as a memory die controller of a memory die. In some embodiments, the control command or mapping request includes instructions for the memory die controller to extract a physical-to-logical mapping of a memory portion (e.g., a block) of non-volatile memory. The memory die controller (e.g., storage control circuitry) may alternatively obtain the mapping request or control command through retrieval from the storage controller. The control command or mapping request may also include information to identify a particular memory portion of non-volatile memory associated with the memory die controller, such as a physical address. In some embodiments, the control command or mapping request includes a number of sub-portions for which to provide the physical-to-logical mapping (e.g., 1024 sub-pages of a memory block).

At block 804, process 800 includes generating a physical-to-logical mapping for the identified memory portion of the non-volatile memory die, found in the control command. At block 806, process 800 may include, in some implementations, reading the header of each sub-portion of the identified memory portion, as a part of generating the physical-to-logical mapping. Reading the header of each sub-portion may further include decoding addressing information, for instance using a decoder. In some implementations, as represented by block 808, generating the physical-to-logical mapping includes determining if the contents of a header of a sub-portion include errors or corrupted data. In some implementations, in accordance with a determination that a respective logical address has one or more errors, process 800 includes performing one or more error correction operations as represented by block 810. Additionally, or alternatively, in some implementations process 800 includes flagging one or more errors in the physical-to-logical mapping in accordance with a determination that a respective logical address has one or more errors and represented by block 812. As described above with respect to FIGS. 6A and 6B, flagging one or more errors in the physical-to-logical mapping may include providing particular information in a respective entry for a corresponding physical address, such as a reserved code word or invalid value for a logical address.

At block 814, process 800 includes sending the physical-to-logical mapping to the storage controller. In some implementations, the memory die controller or storage control circuitry additionally or alternatively provides the physical-to-logical mapping to the storage controller by making it available for retrieval when required by the storage controller.

Figure 9:
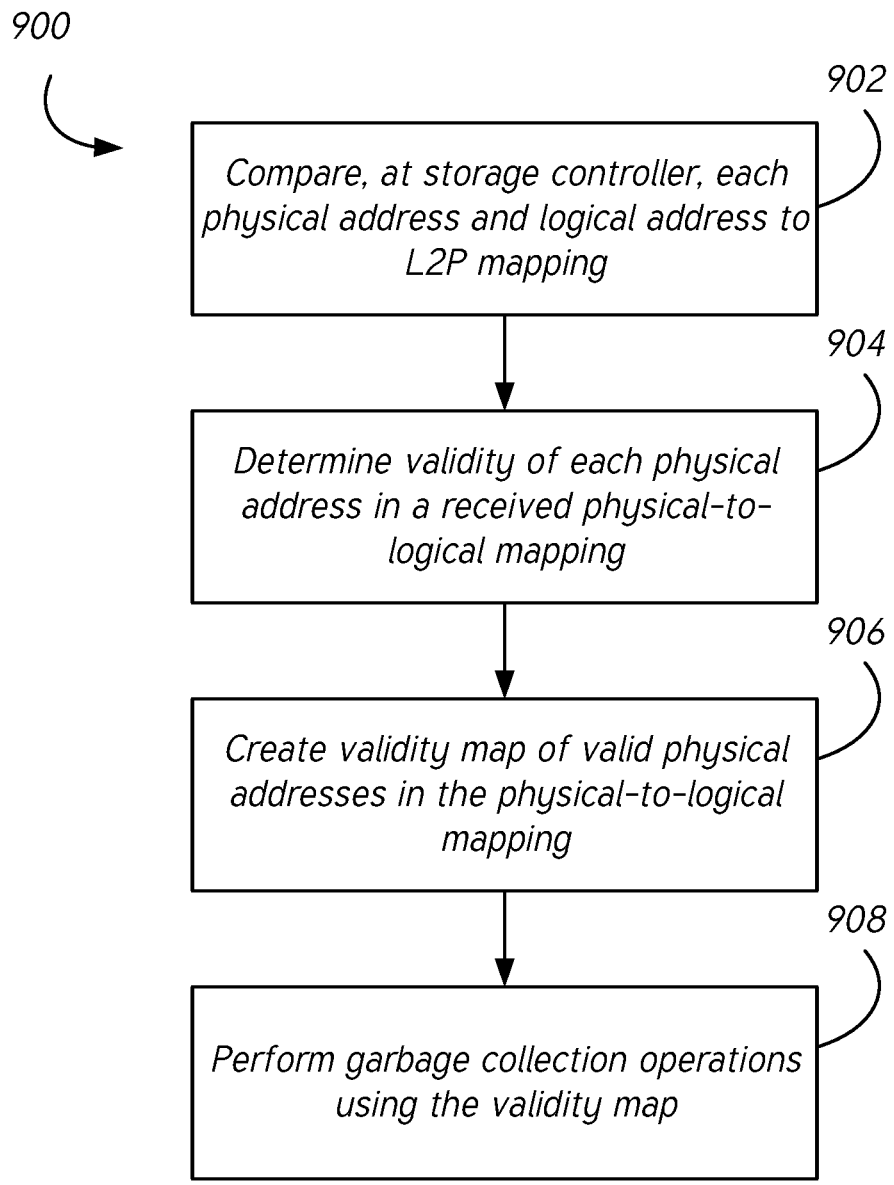
FIG. 9 is a flow diagram illustrating a process for determining validity of addressing information in accordance with one or more embodiments.

FIG. 9 is a flow diagram illustrating a process 900 for validating addressing information in accordance with one or more embodiments. Process 900 may be performed, for example, by control circuitry of a storage device, such as storage controller 140 of a storage device 120, as described herein. The process may be performed, in another example, by a storage controller (e.g., storage controller 140) of the storage device, coupled to a memory die controller of a storage medium, and coupled to a host system. By executing various addressing operations at a storage device, process 900 may provide reductions in bandwidth usage and performance improvements.

At block 902, process 900 includes comparing, at the storage controller, each physical and logical address of a received physical-to-logical mapping from a memory die controller (e.g., memory controller 161 as described herein), to a logical-to-physical (L2P) mapping or table stored at the storage controller (e.g., memory 143 of storage controller 140 as described herein). As block 904, process 900 includes determining validity of each physical address in the received physical-to-logical mapping. For example, if a logical address in the logical-to-physical table has a different physical address associated with it than in the physical-to-logical table, the contents of the invalid entry in the physical-to-logical table are determined to be invalid.

At block 906, process 900 includes creating a validity map of valid physical addresses in the physical-to-logical mapping. In some implementations, the validity map is a distinct data structure from the physical-to-logical mapping received from a memory die controller. The validity map may include valid entries for physical to logical addresses. Additionally, or alternatively, the physical-to-logical mapping information received from the memory die controller itself may be modified to form the validity map.

At block 908, process 900 includes performing garbage collection operations on memory portion, using the validity map. In some implementations, the storage controller may have received a host command to perform an operation on non-volatile memory of the storage device, such as garbage collection. As such, the storage controller may use the validity map generated based on the physical-to-logical mapping received from the memory die controller, to execute the garbage collection operations requested by the host command on a corresponding memory portion.

Figure 10:
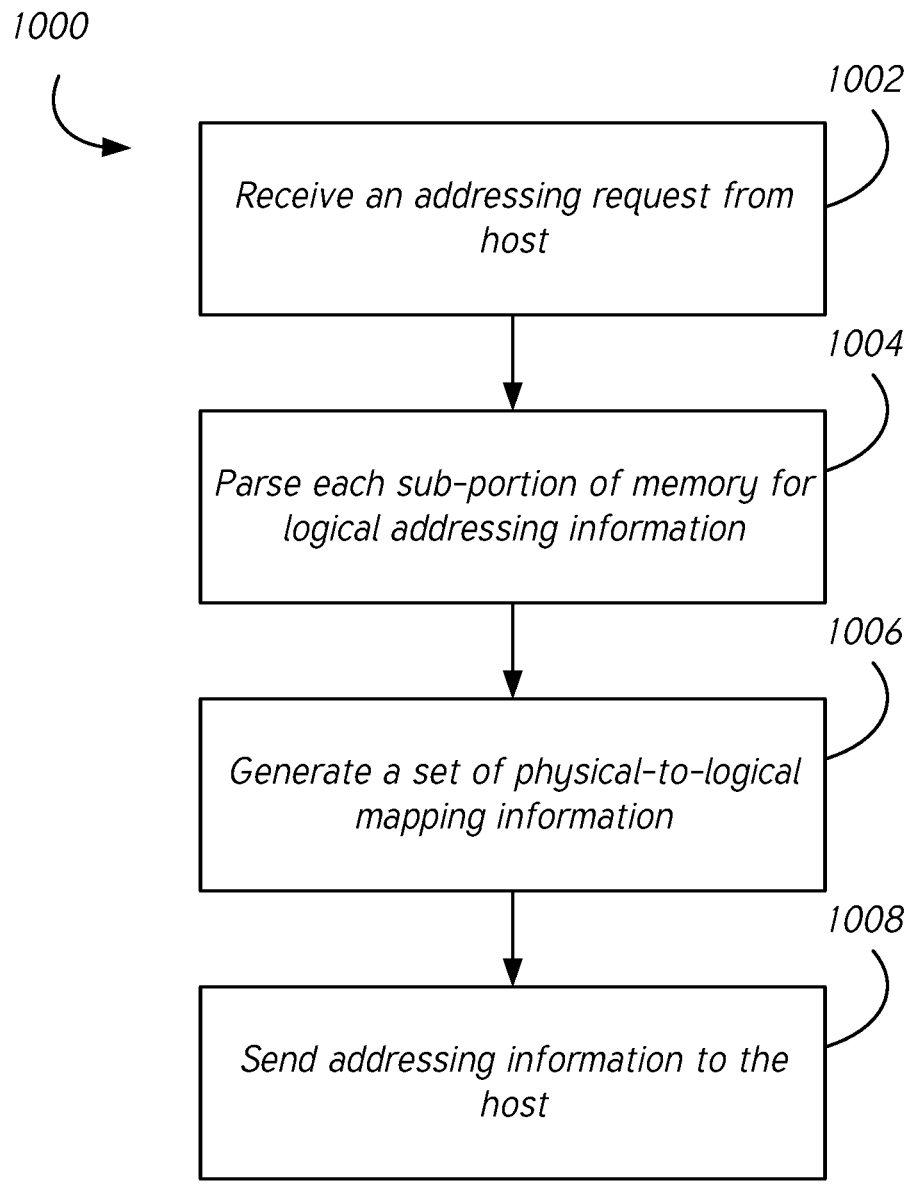
FIG. 10 is a flow diagram illustrating a process for providing addressing information corresponding to a portion of memory, in accordance with one or more embodiments.

FIG. 10 is a flow diagram illustrating a process 1000 for providing addressing information in accordance with one or more embodiments. Process 1000 may be performed, for example, by control circuitry of a storage medium, such as memory controller 161 of a storage medium 160, as described herein. The process may be performed, in another example, by a memory die controller of a storage device, coupled to a storage controller (e.g., storage controller 140) of the storage device. By executing various addressing operations at a storage medium, process 1000 may provide reductions in bandwidth usage and performance improvements, particularly at control circuitry of a storage device.

At block 1002, process 1000 includes receiving an addressing request from a host. For example, as shown in FIG. 5, memory controller 161-N (e.g., a memory die controller), may receive a mapping request (e.g., addressing request) from host 110. In some implementations, the addressing request is received from the host via a storage controller (e.g., storage controller 140 of FIG. 5).

At block 1004, process 1000 includes parsing each sub-portion of memory in the identified memory portion of the addressing request, for logical addressing information. For example, the addressing request may include an identifier for a particular memory portion, and a number of sub-portions to parse for logical addressing information to generate a physical-to-logical addressing table. A memory die controller (e.g., of an associated memory die) may perform this parsing of memory in a memory portion, on a sub-portion basis, to detect and obtain logical addresses for respective sub-portions identified by respective physical addresses.

At block 1006, process 1000 includes generating a set of physical-to-logical mapping information. In some implementations, this generating includes reading the header of each sub-portion of the identified memory portion, decoding addressing information, determining if the contents of a header of a sub-portion include errors or corrupted data, performing one or more error correction operations and/or flagging one or more errors in the physical-to-logical mapping.

At block 1008, process 1000 includes sending addressing information to the host. As with the receipt of the addressing request from the host, in some implementations, sending the addressing information to the host includes sending it via the storage controller. For example, as described with respect to FIG. 5, addressing information is transmitted from memory controller 161-N to host 110, via storage controller 140.

Additional Embodiments

Those skilled in the art will appreciate that in some embodiments, other types of data storage systems and/or memory addressing schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Methods and processes described herein may be embodied in, and partially or fully automated via, software code modules executed by one or more general and/or special purpose computers. The word "module" may refer to logic embodied in hardware and/or firmware, or to a collection of software instructions, possibly having entry and exit points, written in a programming language, such as, for example, C or C++. A software module may be compiled and linked into an executable program, installed in a dynamically linked library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an erasable programmable read-only memory (EPROM). "Module" may further refer to one or more devices, components, systems, or subsystems, which may conceptually implement relevant functionality. It will be further appreciated that hardware modules may be comprised of connected logic units, such as gates and flip-flops, and/or may be comprised of programmable units, such as programmable gate arrays, application specific integrated circuits, and/or processors. The modules described herein are preferably implemented as software modules, but may be represented in hardware and/or firmware. Moreover, although in some embodiments a module may be separately compiled, in other embodiments a module may represent a subset of instructions of a separately compiled program, and may not have an interface available to other logical program units.

What is claimed is:

1. An apparatus comprising:
    a non-volatile memory die; and
    a memory die controller associated with the non-volatile memory die and in response to a mapping request from a storage controller configured to:
        read a logical address from a header of a sub-portion of memory;
        map a physical address corresponding to the logical address of the sub-portion within a physical-to-logical mapping;
        correct data errors in the physical-to-logical mapping; and
        transmit the physical-to-logical mapping to the storage controller.

2. The apparatus of claim 1, wherein:
    the storage controller is configured to send the mapping request to the memory die controller, the mapping request configured to return the physical-to-logical mapping.

3. The apparatus of claim 1, wherein the mapping request identifies a physical address of a block of memory and a number of sub-pages to map in the block of memory.

4. The apparatus of claim 1, wherein the storage controller is further configured to:
    determine that a logical address in the physical-to-logical mapping is corrupted;
    retrieve error correction information corresponding to the corrupted logical address; and generate a corrected value of the determined corrupted logical address, using the error correction information.

5. An apparatus comprising:
a storage controller coupled to a host;
a non-volatile memory die; and
a memory die controller coupled to the storage controller and associated with the non-volatile memory die, configured to:
receive a mapping request from the host;
extract identification information from the mapping request to identify a portion of the non-volatile memory die for mapping logical addresses;
generate physical-to-logical addressing information corresponding to the portion of the non-volatile memory; and
transmit the physical-to-logical addressing information to the host.

6. The apparatus of claim 5, wherein:
the memory die controller is further configured to:
receive the mapping request from the storage controller; and
transmit the physical-to-logical addressing information to the storage controller for transmission to the host.

7. An apparatus comprising:
a storage device controller;
a plurality of non-volatile memory die; and
a plurality of memory die controllers, each respective memory die controller coupled to a respective non-volatile memory die and the storage device controller and comprising:
request communication circuitry configured to receive a mapping request from the storage device controller identifying a portion and a number of sub-portions of the respective non-volatile memory die for mapping logical addresses;
an address decoder configured to decode information in a header of each sub-portion of the identified portion to retrieve a logical address;
addressing information generation circuitry configured to generate addressing information from the logical address of each sub-portion; and
addressing communication circuitry configured to send addressing information of the identified portion to the storage device controller.

8. The apparatus of claim 7, wherein each sub-portion includes a respective header comprising a respective logical address and a corresponding body comprising error correction information of the respective logical address.

9. The apparatus of claim 7, wherein the storage device controller comprises map maintenance circuitry configured to relate each logical address in the addressing information with a physical address of a sub-portion to form a physical-to-logical map of the portion.

10. An apparatus comprising:
a storage device controller;
a plurality of non-volatile memory die; and
a plurality of memory die controllers, each respective memory die controller coupled to a respective non-volatile memory die and the storage device controller and comprising:
request communication circuitry configured to receive an addressing request originating from a host;
a memory parser configured to parse each sub-portion of a portion of memory on a sequential basis, for a logical address;
mapping generation circuitry configured to generate physical-to-logical mapping information from the logical address of each sub-portion; and
addressing communication circuitry configured to send addressing information of the portion of memory to the host.

11. The apparatus of claim 10, wherein the addressing request is generated by the storage device controller in response to receiving a host command at the storage device controller from the host.

12. The apparatus of claim 10, wherein the addressing request is generated by the host, and each respective memory die controller is further configured to receive the addressing request from the storage device controller.

13. An apparatus comprising:
a storage controller;
a plurality of non-volatile memory die;
a plurality of non-volatile memory controllers associated with the plurality of non-volatile memory die, each non-volatile memory controller comprising:
means for reading a respective sub-portion of a portion of a respective non-volatile memory die;
means for retrieving a logical address stored in the respective sub-portion, identified by a respective physical address;
means for determining if the logical address has one or more errors; and
means for storing the logical address with the respective physical address in a physical-to-logical table, in accordance with a determination that the logical address does not have one or more errors.

14. The apparatus of claim 13, wherein each non-volatile memory controller further comprises:
means for identifying an erroneous value of the logical address in the physical-to-logical table, in accordance with a determination that the logical address has one or more errors.

15. The apparatus of claim 13, wherein the storage controller further comprises:
means for determining validity of each respective physical address stored in the physical-to-logical table; and
means for creating a validity map of valid physical addresses of the portion.

16. The apparatus of claim 15, wherein the storage controller further comprises:
means for performing garbage collection operations on the portion of the non-volatile memory die using the validity map.

17. A method comprising:
receiving a control command at a memory die controller of a storage device from a storage controller of the storage device, wherein the control command includes a request to extract a physical-to-logical mapping of a portion of a non-volatile memory die corresponding to the memory die controller;
generating a physical-to-logical mapping for the portion of the non-volatile memory die indexed by physical addresses of the portion, including reading a respective header of each respective sub-portion of the portion, each sub-portion identified by a respective physical address; and
sending the generated physical-to-logical mapping to the storage controller.

18. The method of claim 17, wherein generating the physical-to-logical mapping includes:
detecting a first logical address at a first physical address of the portion of the non-volatile memory die;

extracting the first logical address from a header of the first physical address; and determining if the first logical address has one or more errors.

19. The method of claim 18, further comprising:
in accordance with a determination that the first logical address has one or more errors:
extracting error detection information corresponding to the first logical address stored at the first physical address; and
replacing a value of the extracted first logical address with a corrected value using the error detection information.

20. The method of claim 18, further comprising:
in accordance with a determination that the first logical address has one or more errors:
indicating the first physical address corresponding to the first logical address is invalid in the physical-to-logical mapping.

21. The method of claim 17, further comprising:
comparing, at the storage controller, addressing information in the physical-to-logical mapping to addressing information in a logical-to-physical mapping of data stored in the storage device;
determining validity of each respective physical address in the physical-to-logical mapping;
creating a validity map of the valid physical addresses of the portion; and
performing garbage collection operations on the portion of the non-volatile memory die using the validity map.

22. The method of claim 21, wherein determining validity of each respective physical address includes determining duplication of any respective logical address in the physical-to-logical mapping.

23. The method of claim 21, wherein determining validity of each respective physical address includes performing one or more error correction operations on an identified invalid physical address in the portion.

24. A system comprising:
a board comprising electrical connections;
a storage controller die mounted on the board; and
a memory die mounted on the board and electrically coupled to the storage controller die via the electrical connections, the memory die comprising:
a solid-state memory array comprising a plurality of portions of non-volatile memory; and
control circuitry coupled to the memory array via a plurality of control lines, wherein the control circuitry is configured to:
communicate with the storage controller die to report on physical-to-logical addressing of a portion of the memory array;
read each sub-portion of the portion of the memory array for a corresponding logical address;
analyze the corresponding logical address for erroneous information;
assemble the physical-to-logical addressing of the portion; and
transmit to the storage controller die a string representing the physical-to-logical addressing of the portion.

25. The system of claim 24, wherein the string includes one or more identified erroneous logical addresses in the portion of the memory array.

* * * * *